(12) United States Patent
Miura et al.

(10) Patent No.: US 6,587,934 B2
(45) Date of Patent: Jul. 1, 2003

(54) MEMORY CONTROLLER AND DATA PROCESSING SYSTEM

(75) Inventors: Seiji Miura, Hachioji (JP); Kazushige Ayukawa, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/931,860

(22) Filed: Aug. 20, 2001

(65) Prior Publication Data

US 2002/0023197 A1 Feb. 21, 2002

(30) Foreign Application Priority Data

Aug. 21, 2000 (JP) .................................. 2000-254245

(51) Int. Cl.[7] .............................................. G06F 12/00
(52) U.S. Cl. ........................... 711/154; 711/5; 711/105; 711/163; 711/170; 365/185.12; 365/185.25; 365/203; 365/235
(58) Field of Search ........................ 711/5, 105, 154, 711/157, 163, 167; 365/203, 235, 238.5, 230.08, 185.12, 185.25

(56) References Cited

U.S. PATENT DOCUMENTS

| | | | | |
|---|---|---|---|---|
| 5,889,714 A | * | 3/1999 | Schumann et al. | 365/203 |
| 5,907,512 A | * | 5/1999 | Parkiinson et al. | 365/195 |
| 6,052,134 A | * | 4/2000 | Foster | 345/521 |
| 6,108,745 A | * | 8/2000 | Gupta et al. | 711/3 |
| 6,144,616 A | * | 11/2000 | Suzuki et al. | 365/233 |
| 6,199,185 B1 | * | 3/2001 | Ju et al. | 714/744 |
| 6,219,765 B1 | * | 4/2001 | Jeddeloh | 711/154 |
| 6,272,594 B1 | * | 8/2001 | Gupta et al. | 711/127 |
| 6,279,083 B1 | * | 8/2001 | MacDonald | 711/138 |
| 6,389,514 B1 | * | 5/2002 | Rokicki | 711/136 |
| 6,408,371 B1 | * | 6/2002 | Jeddeloh | 711/170 |

* cited by examiner

Primary Examiner—Reginald G. Bragdon
Assistant Examiner—Jasmine Song
(74) Attorney, Agent, or Firm—Miles & Stockbridge P.C.

(57) ABSTRACT

A memory controller and data processor have their operation mode switched from the page-on mode for high-speed access to a same page to the page-off mode in response to consecutive events of access to different pages, so that the memory access is performed at a high speed and low power consumption.

11 Claims, 25 Drawing Sheets

FIG. 6
| BANK | PS | TRAD |
|---|---|---|
| 0 | L | 2 |
| 1 | H | 5 |
| 2 | H | 10 |
| 3 | H | 41 |
L: LOW  H: HIGH
FIG. 7A
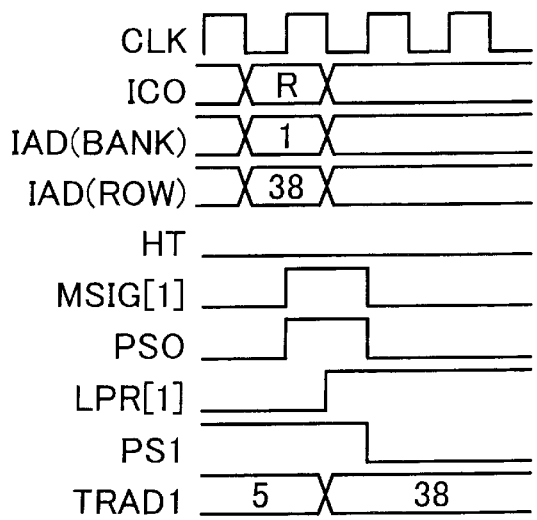
FIG. 7B
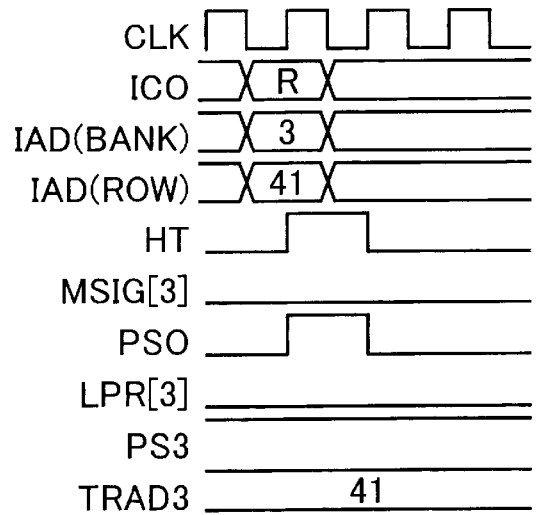

FIG. 9

| MODE LPR | PAGE ON MODE L | | | | PAGE OFF MODE H | | | |
|---|---|---|---|---|---|---|---|---|
| PAGE HT | SAME PAGE H | | DIFFERENT PAGE L | | SAME PAGE H | | DIFFERENT PAGE L | |
| PS | H | L | H | L | H | L | H | L |
| COMMAND SEQUENCE | RD | AC ↓ RD | PRE ↓ AC ↓ RD | AC ↓ RD | RD ↓ PRE | AC ↓ RD ↓ PRE | PRE ↓ AC ↓ RD ↓ PRE | AC ↓ RD ↓ PRE |
| READ LATENCY | 5 | 7 | 9 | 7 | 5 | 7 | 9 | 7 |
| WRITE LATENCY | 3 | 5 | 7 | 5 | 3 | 5 | 7 | 5 |
| | (A) | (B) | (C) | (D) | (E) | (F) | (G) | (H) |

FIG. 14

| BANK | PRAD |
|---|---|
| 0 | 8 |
| 1 | 6 |
| 2 | 105 |
| 3 | 15 |

FIG. 15

| BANK | PF |
|---|---|
| 0 | H |
| 1 | L |
| 2 | L |
| 3 | H |

L: LOW  H: HIGH

MEMORY CONTROLLER AND DATA PROCESSING SYSTEM

BACKGROUND OF THE INVENTION

1. Field of the Invention

The present invention relates to a memory controller which can have memory access, a data processor which has the memory controller and a central processing unit, and a data processing system which has the data processor and a memory. The invention also relates to a technique which is useful when applied to a semiconductor device having the above-mentioned items formed in one package.

2. Description of the Prior Art

A data processor having a central processing unit (CPU) makes access to memories which include a main memory and a cache memory. The main memory stores programs to be run and data to be processed by the CPU. The main memory formed in a semiconductor device is known to be a large-capacity memory which is typically made of volatile memories such as a DRAM (dynamic random access memory) or nonvolatile memories such as a flash memory. The cache memory is made of memories having relatively small capacities such as a SRAM (static random access memory). The cache memory is located between the CPU having a high-speed operation and the main memory which operates slower than the CPU, thereby absorbing difference in their operational speeds.

For a high-speed operation of a data processing system having a CPU, cache memory and main memory, there has been a technique of using the sense amplifiers of the DRAM of main memory in a manner like cache memory. The technique of using DRAM's sense amplifiers in a manner like cache memory will be explained as follows. The data processor first puts out a row address to the DRAM. The DRAM has its word lines selected by a row address, and data of the full one line on the selected word line are transferred to and held by the sense amplifiers. The data processor next puts out a column address to the DRAM. The column address selects certain column switches, causing the sense amplifiers to release the data.

The sense amplifiers hold the data of the full one line of the selected word line continuously after the readout of data. At the next DRAM access by the data processor, if the row address is the same as the previous one, the data processor puts out only a column address. Generally, word line selection takes a relatively long time, whereas by retaining data in the sense amplifiers, it is possible to read out data in a short time for an event of access with the same word line, i.e., access to the same page.

However, the foregoing prior art involves the following problem. In case data is to be read out from a word line which is different from the word line where data are held by sense amplifiers, i.e., at the occurrence of cache error in the cache-wise use of sense amplifiers, it is necessary to cancel the selection of the immediate word line, precharge the data lines, and thereafter select a new word line. The need of precharging at this access results in a longer data read time than usual data readout.

There are several techniques intended to overcome the above-mentioned problem as described in JP-A Nos. 1994-131867, 1995-78106 and 2000-21160.

The JP-A No. 1994-131867 discloses a technique for speeding up the read and write operations of a DRAM, with its sense amplifiers being used as cache memory, even at the occurrence of cache error. Specifically, the DRAM has its data lines divided into data lines which are connected to the memory cells and pre-amplifiers, and global data lines which are connected to the main amplifiers used as cache memory.

It also shows the arrangement of a means of shorting the data lines, which are connected with the memory cells and pre-amplifiers, independently of the global bit lines. This arrangement enables the precharging of the data lines which are connected with memory cells and pre-amplifiers even in the data holding state for one page of the main amplifiers connected to the global data lines, and thus enables the preparation for reading out data from another page, i.e., another word line.

The JP-A No. 1995-78106 discloses a technique for speeding up the read and write operations of a DRAM, with its sense amplifiers for memory banks being used as cache memory, even at the occurrence of alternate access between memory banks. Specifically, a data processing system is provided in its DRAM control circuit with row address memory means in correspondence to the memory banks. This arrangement enables the judgement as to whether the memory access is to the same row address as the previous access, i.e., whether the access is to the same page, for each memory bank, and thus enables the high-speed block data transfer.

The JP-A No. 2000-21160 discloses a technique for the use of sense amplifiers for memory banks of a multi-bank DRAM as cache memory. It shows, with the intention of enhancing the hit rate of sense amplifier cache, a means of advanced reading of data of a predicted address based on the advanced issuance of the next address which is determined by adding a certain offset value to the previous address of the memory bank which has been accessed previously.

The inventors of the present invention have found the unevenness of access to the main memory in reading a program to be run by the central processing unit or reading data out of the main memory. For example, there are a case of frequent access to the same page (same word line) of the main memory, a case of frequent access to different pages, and a case of access to a same page and access to different pages at an equal frequency. The unevenness of access results largely from the characteristic of a program. The inventors of the present invention have found that the above-mentioned prior arts cannot deal with the unevenness of access frequency sufficiently and cannot solve the problem of slower data read/write operations from/to the main memory due to the unevenness.

SUMMARY OF THE INVENTION

An object of the present invention is to provide a data processor having its main memory sense amplifiers, e.g., DRAM, used as cache memory, and a data processing system having the data processor and main memory, with the intention being the speed-up of main memory access thereby to speed up the whole data processing system.

These and other objects and novel features of the present invention will become more apparent from the following description taken in conjunction with the accompanying drawings.

Representing means of carrying out the present invention are as follows.

There is provided a means of checking as to whether the immediate memory access is to the same page as of the previous access or to a different page, and switching the memory control mode accordingly. There is provided a memory controller having a page mode, wherein the page mode is cancelled at an event of different page access or the row address output is skipped at an event of same page access. Upon canceling the page mode, it enters the operation mode of precharge control after putting out a column address at an event of memory access.

The precharge control is to bring-the RAS signal to the high level on expiration of a certain time length following the output of a column address. In other words, the precharge control is to issue a precharge command on expiration of a certain time length following the output of the column address.

The memory controller may have a register for setting as to whether or not the cancellation of page mode is to take place. The page mode will also be called "page-on mode" or "RAS-down mode".

Another means is a memory controller having a page mode, wherein the page mode is cancelled at successive events of access to different pages. At an event of different page access, it implements precharge control and thereafter puts out a row address, or it implements the precharge control without the row address output at an event of same page access.

The precharge control is to put out a high-level RAS signal. In addition, the precharge control is to issue a precharge command, and put out a row address on expiration of a certain time length following the issuance of the precharge command.

Upon canceling the page mode, the memory controller enters the operation mode of bringing the RAS signal to the high level on expiration of a certain time length following the column address output at an event of memory access. In addition, upon canceling the page mode, it enters the operation mode of issuing the precharge command on expiration of a certain time length following the column address output at an event of memory access.

The memory controller may have a register for setting as to whether or not the cancellation of page mode is to take place.

Another means is a memory controller having a first operation mode and second operation mode, and it switches from the first mode to the second mode at an event of access to a second page which is different from a first page, following the access to the first page. In the second mode, it switches from the second mode to the first mode at an event of access to a third page following the access to the third page. The first mode is to have successive events of access to a same page, and the second mode is to have successive events of access to different pages. The time expended to make access to a same page a certain number of times in the first mode is shorter than the time expended to make access to the same page the same number of times in the second mode.

Another means is a memory controller having a first operation mode in which memory access takes place with the output of a column address and without the output of a row address, and a second operation mode in which memory access takes place with the implementation of precharge control following the output of a row address and column address. It switches to the first mode at an event of memory access with the output of a row address and column address following the implementation of precharge control. At an event of memory access to a same row address in the second mode, it switches to the first mode.

The memory controller may have a register for setting as to whether or not the switching between the first and second modes is to take place.

The precharge control of the second mode is to put out a high-level RAS signal on expiration of a prescribed time length following the column address output. In addition, the precharge control of the second mode is to issue the precharge command on expiration of a prescribed time length following the column address output.

Another means is a data processing system including a central processing unit (CPU) which puts out an address, a memory controller which is supplied with the address and adapted to operate in a first mode and second mode, and a memory which is controlled by the memory controller. In the first mode, the memory controller switches from the first mode to the second mode at an event of access to a second page which is different form a first page following the access to the first page.

The data processing system has a register circuit for setting as to whether or not the switching between the first and second modes is to take place. The CPU can alter the setting of the register circuit. The CPU and memory controller may be formed on a same semiconductor chip. Alternatively, the CPU, memory controller memory may be formed in one semiconductor package.

Another means is a memory controller having a first memory access mode in which it makes access to the memory by putting out a column address but without putting out a row address, a second memory access mode in which it precharges the memory and thereafter puts out a row address and column address, and a third memory access mode in which it puts out a row address and column address to the memory and thereafter precharges the memory, and operating to have the first memory access, and thereafter the second memory access, and thereafter the third memory access. Alternatively, the first memory access may be followed by the second memory access a number of times, which may be followed by the third memory access.

Still another means is a memory controller having an input node, a first register circuit which holds the address put to the input node, a first comparator circuit which compares the address put to the input node with the address held by the first register circuit, a second comparator circuit which compares the output of the first comparator circuit with the contents of a second register circuit, and a first circuit which is set to a first state or second state depending on the output of the second comparator circuit. The first comparator circuit releases a value which is the number of times of the comparison result of inequality or disagreement between the address held by the first register circuit and the address put to the input node, and the second comparator circuit compares the count value provided by the first comparator circuit with the contents of the second register circuit.

The memory controller may further include a second circuit which releases a first and second parts of the address put to the input node in response to the setting of the first state of the first circuit or the first part of the address put to the input node in response to the setting of the second state of the first circuit, and an output node which releases the output of the second circuit to the memory.

Alternatively, the first register circuit holds part of the address put to the input node, and the first comparator circuit compares part of the address put to the input node with part of address held by the first register circuit. Alternatively, the first comparator circuit compares a first address put to the input node with a second address which has been put to the input node before the first address.

Alternatively, an address put to the input node has a number of bits and the first register circuit has a number of fields, and the first comparator circuit compares the first address with the address which is held in one of the fields specified by a certain bit of the first address. The first and second parts of address maybe a row address and a column address, respectively, of the memory. The input node may be supplied with an address which is put out by the CPU.

Another means is a memory controller which can adjust the correspondence between an address put out by the CPU and a memory address based on information of the line size, index and tag indicative of the structure of the primary cache of CPU and information of the column address, row address and bank address indicative of the structure of the memory accessed by the CPU.

In combination with the foregoing means, with the intention of further raising the frequency of access to the same page of the memory, an event of access to a memory is followed by the advanced issuance of the next address (evaluated by the addition of a certain offset value to the previous address) and data of the predicted address is held in the sense amplifiers of a bank in a different memory.

The memory may be controlled based on the judgement as to whether the previous predicted address is to the same page as the immediate access, and the predicted address is validated in the case of a same page access or invalidated in the case of a different page access.

The memory controller may further include an additional arrangement for aligning automatically an address put out by the CPU and a memory address based on information of the line size, index and tag indicative of the structure of the primary cache of CPU and information of column address, row address and bank address indicative of the structure of the memory accessed by the CPU. This additional arrangement can be either added to the foregoing arrangement or used independently to achieve the effectiveness of the present invention.

BRIEF DESCRIPTION OF THE DRAWINGS

FIG. 6 is a table showing information held by the page access checking circuit of the first embodiment;

FIGS. 7A and 7B are timing charts showing the operation of the page access checking circuit of the first embodiment;

FIG. 9 is a table showing the operation of the address generation circuit of the first embodiment;

FIG. 14 is a table showing information held by the predicted address checking circuit of the second embodiment;

FIG. 15 is a table showing information held by the predicted address generation circuit of the second embodiment;

DESCRIPTION OF THE PREFERRED EMBODIMENTS

Figure 1:
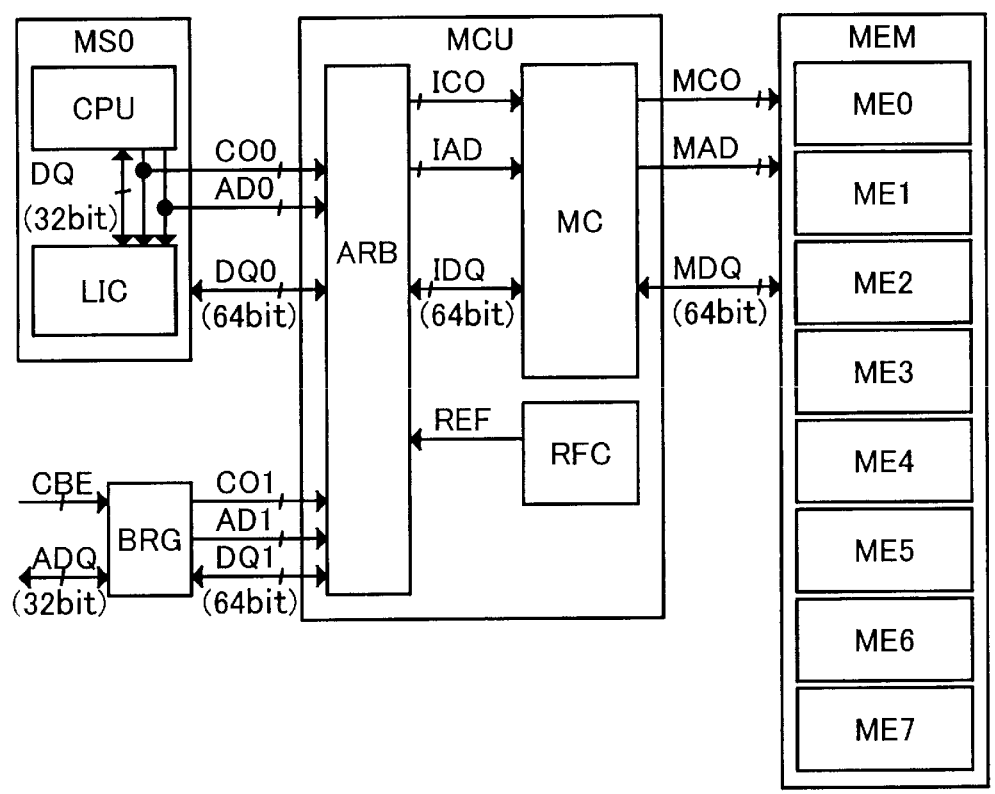
FIG. 1 is a block diagram of the data processing system based on a first embodiment of this invention.

FIG. 1 shows by block diagram the data processing system based on the first embodiment of this invention. A data processor (MS0) includes a central processing unit (CPU) and a primary cache memory (L1C). The data processor MS0 may further include other devices such as a floating point unit (FPU), but these devices which are not directly concerned with the present invention are not shown and explained.

The CPU uses a 32-bit address signal, although this is not compulsory., to deal with the address space, which is partially allotted to a memory module (MEM). The memory module MEM, which has a role of the main memory, is made up of a number of memories (ME0–ME7). The memories store programs and data to be run and used by the CPU (in the following explanation, programs and data will be termed commonly as "data" without distinction). Each memory of this embodiment is made up of four memory banks each provided with sense amplifiers. The number of memory banks may be two or eight or more instead of four, or the memory may not even have a bank structure.

Provided between the data processor MS0 and memory module MEM is a memory control unit (MCU) which controls the memory module MEM. The memory control unit is connected with a PCI (peripheral component interconnect) bridge circuit (BRG) which is used for data transfer from the outside of the data processing system to the memory module.

The memory control unit MCU has a refresh control circuit (RFC) which controls the refreshing of the memories in the memory module. It also has an arbiter circuit (ARB)

which arbitrates the memory access from the CPU, memory access from the refresh control circuit for the refreshing of memory module, and memory access from the PCI bridge circuit BRG. The arbiter circuit watches access requests from the CPU, refresh control circuit and PCI bridge circuit, and it grants one of access requests in accordance with the priority order. In this embodiment, the refresh control circuit, CPU and PCI bridge circuit have the first, second and third priority orders, although this is not compulsory.

The memory control unit further has a memory control circuit (MC) which controls the memory module in response to an access request granted by the arbiter circuit. The refresh control circuit implements the refresh operation necessary for a DRAM as memories of the memory module.

The data processor and memory control unit in combination will be called data processor device, but the data processor can incorporate the memory control unit of this invention. The data processor of this embodiment operates in synchronism with a clock signal CLK (not shown). These features are common to all embodiments of this invention.

Next, the operation of the data processing system will be explained. The CPU makes a data read or write access to the memory module MEM by putting out the read command and memory address to the arbiter circuit ARB over a C00 bus and AD0 bus, respectively. The arbiter circuit grants the access request from the CPU in accordance with the arbitration rule, and it puts the read command and address to the memory control circuit MC over an IC0 bus and IAD bus, respectively. On receiving the read command and address from the arbiter circuit, the memory control circuit controls the memories ME0–ME7 in the memory module MEM.

Figure 2:
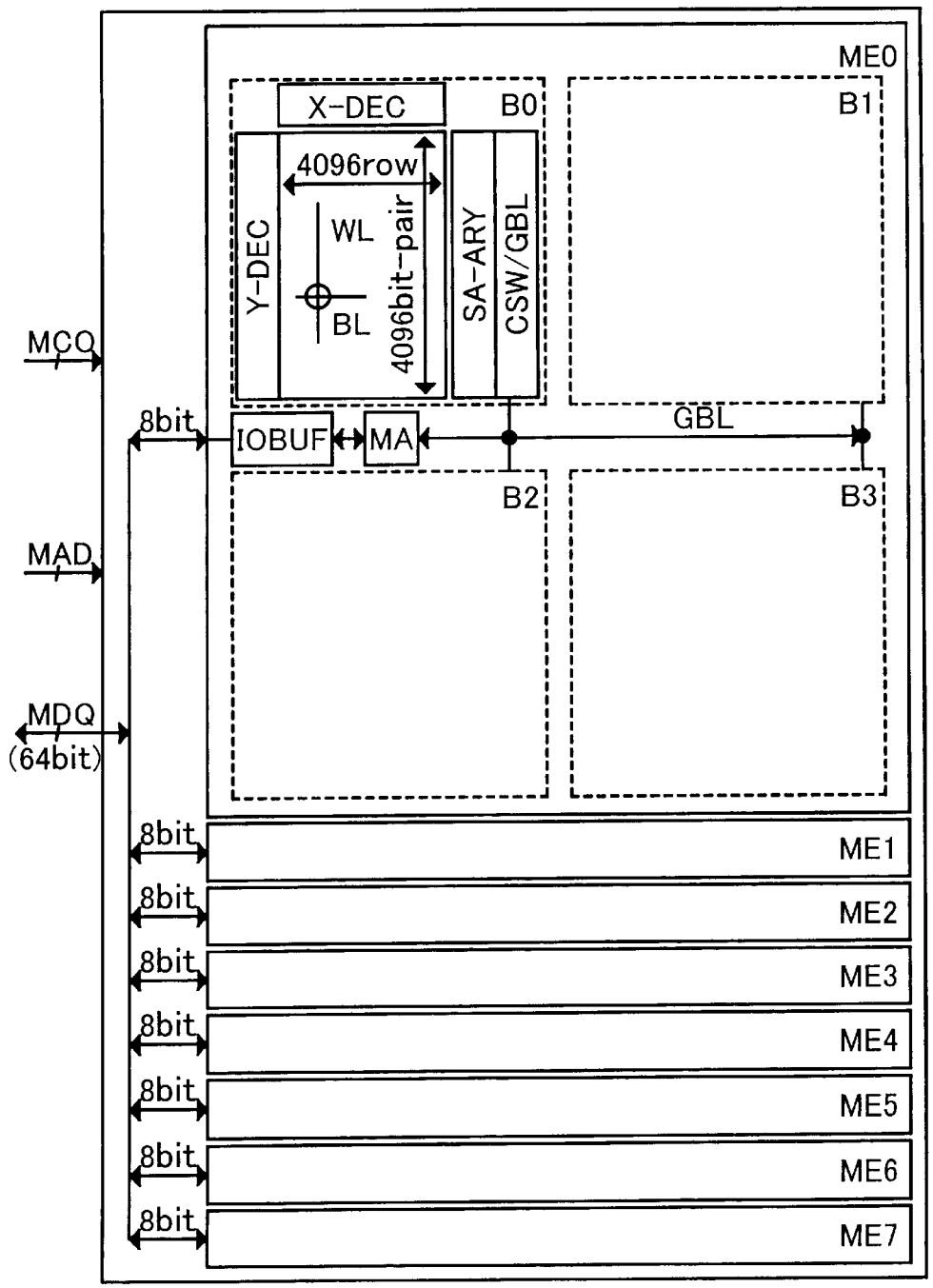
FIG. 2 is a block diagram of the memory module of the first embodiment.

FIG. 2 shows the detailed structure of the memory module MEM. The memory module of this embodiment is made up of eight memories ME0–ME7. The memory ME0 in the memory module has four memory banks (B0–B3), a main amplifier (MA) and an input/output buffer (IOBUF). The remaining memories ME1–ME7 are the same as ME0. The memory bank B0 has a memory array, a row decoder (X-DEC), a column decoder (Y-DEC), a sense amplifier array (SA-ARY), and column switches (CSW) and global bit lines (GBL). The remaining memory banks B1–B3 are the same as the B0.

The memory control unit MCU and memory module MEM transact data with each other through a 64-bit bus (MDQ). The 64-bit bus is divided for eight memories ME0–ME7 of the memory module so that each memory is connected with an 8-bit bus. All memories ME0–ME7 operate simultaneously in response to the command from the memory control circuit MC, and the memory module MEM reads and writes 64-bits data at once. The memories ME0–ME7 of this embodiment can be controlled separately among the four memory banks.

Figure 3:
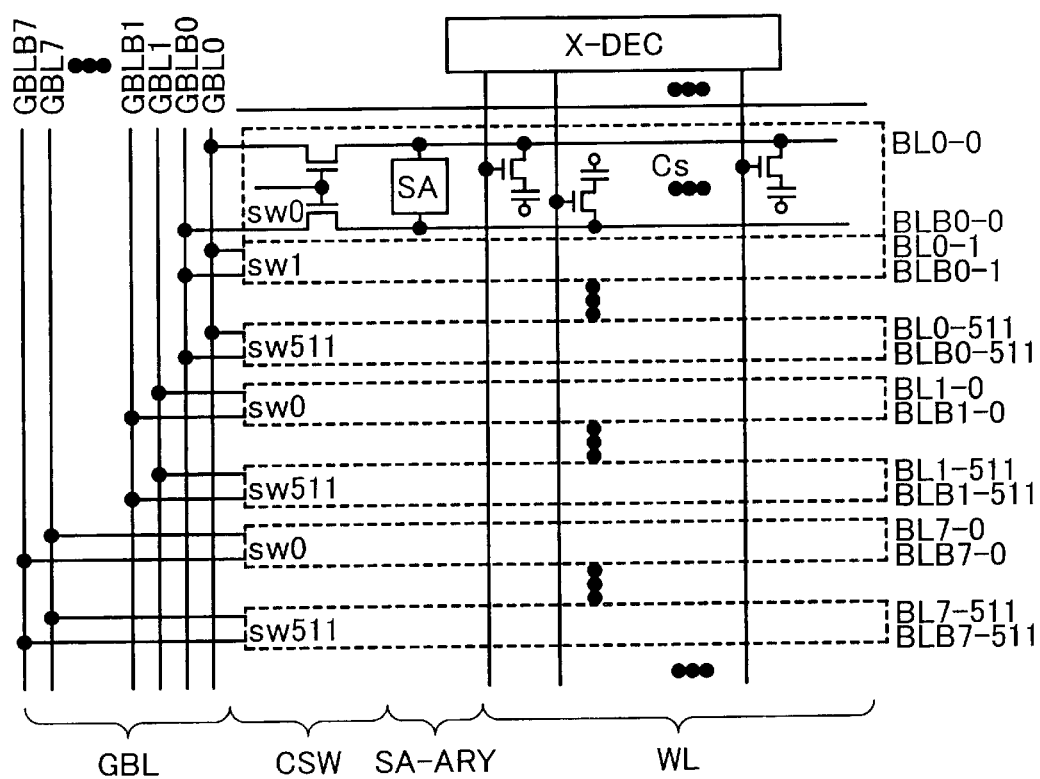
FIG. 3 is a schematic circuit diagram of a memory bank of the first embodiment.
Figure 4:
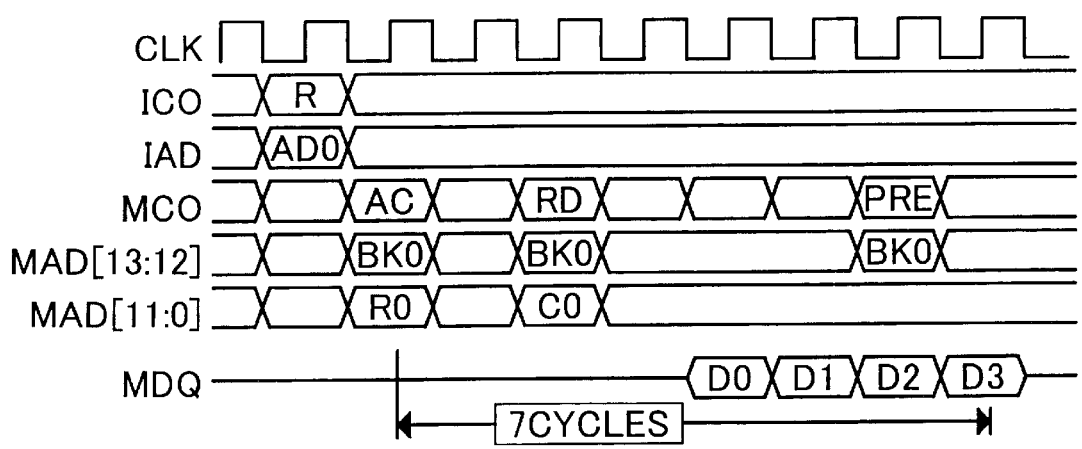
FIG. 4 is a timing chart showing the operation of the memory control circuit of the first embodiment.

FIG. 3 and FIG. 4 show the detailed structure of the memory bank and the operation of the memory module MEM. In the following explanation of this embodiment, the memory is assumed to be a synchronous DRAM.

The signals on the signal lines shown in FIG. 1 will be explained on the timing chart of FIG. 4. The CPU puts out the read command and memory address, which are conducted via the arbiter circuit ARB over the ICO and IAD buses and put into the memory control circuit MC. The memory control circuit puts out a bank activate command AC over a MC0 bus and puts out over a MAD bus a bank address BK0 (2 bits 13–12 of MAD) and row address R0 (12 bits 11–0 of MAD) to the memory module. Subsequently, it puts out a read command RD over the MC0 bus and the bank address BK0 (bits 13–12 of MAD) and column address C0 (9 bits 8–0 of MAD) over the MAD bus. The commands and addresses released by the memory control circuit are put in parallel into the eight memories of the memory module MEM, and these memories have the same read operation. The transaction of commands, addresses and data is timed to the clock signal of the data processing system in this embodiment.

The eight synchronous DRAMs (ME0–ME7) of the memory module MEM shown in FIG. 2 have common inputs of commands and addresses, and the operation of one synchronous DRAM (SDRAM0) will be by explained in the following.

The bank activate command AC, bank address BK0 and row address R0 are put into the SDRAM0, and the row decoder X-DEC of bank B0 which is selected from among the four memory banks by the bank address BK0 selects a word line WL out of 4096 word lines of the memory bank. The memory bank B0 shown in FIG. 2 is shown in more detail in FIG. 3. In response to the selection of a word line, data of memory cells of one 4096-bit page is transferred over 4096 bit line pairs (BL0-0/BLB0-0 through BL7-511/BLB7-511) to the sense amplifier array SA-ARY and amplified and held by 4096 amplifiers, respectively.

Subsequently, for reading out the data held by the sense amplifiers, the read command RD and the same bank address BK0 as for word line selection and column address C0 are put into the SDRAM0 over the MC0 bus and MAD bus, respectively. The bank address BK0 selects one of the four memory banks in the same manner as word line selection, and the column decoder Y-DEC of the selected bank selects eight column switches out of 4096 column switches CSW by the column address C0. The eight column switches selected by the column decoder Y-DEC lead out data from the sense amplifiers onto the global bit lines (GBL0–GBL7). The 8-bit data on the global bit lines is placed on the MDQ bus via the main amplifier MA and input/output buffer IOBUF shown in FIG. 2. At the output of data onto the MDQ bus, the remaining seven SDRAMs also release data, i.e., total output of 64-bit data.

Subsequently, the memory control circuit MC puts out a precharge command PRE and bank address BK0 for the precharge control. In consequence, the selection of word line of the selected memory bank is cancelled, and precharging of the bit lines takes place. The timing of precharging following the column address output is probably stated in standards. The precharge timing is on expiration of 4 clocks following the column address output in both cases of synchronous and asynchronous memories of this invention, although this is not compulsory.

Specifically, the RAS signal is brought to the high level to implement precharging, and the page is closed. In the foregoing operation, the latency of memory access after the memory control circuit MC puts out the bank activate command AC to the memory module MEM until the memory module releases data is 7 cycles.

As the present embodiment employs an example of 4 bits burst mode as shown in FIG. 4, the access latency is 7 cycles. If one bit burst mode is employed, however, the access latency will be 3 cycles. One bit burst mode may be defined as a read out mode wherein one bit read out data is outputted in response to one read command.

Figure 5:
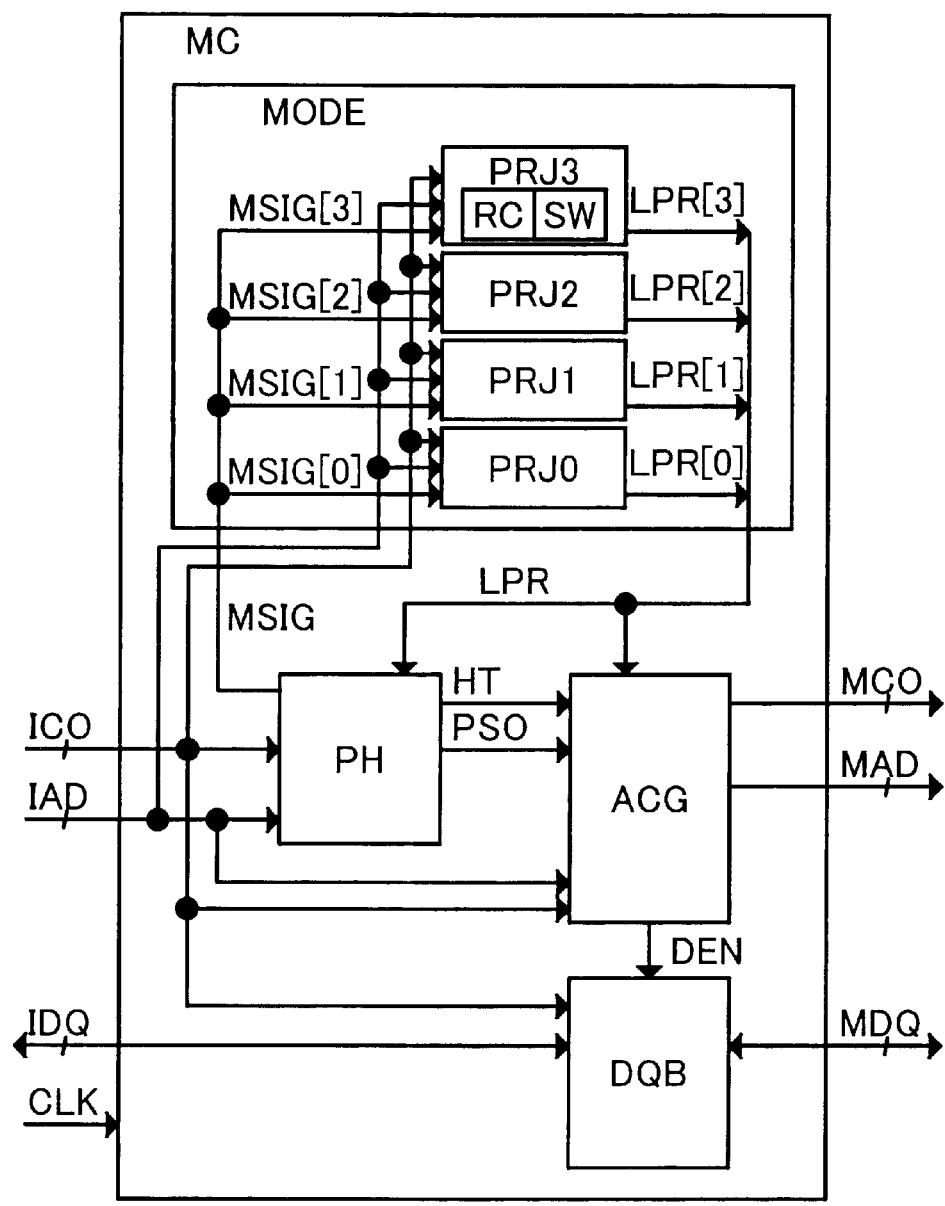
FIG. 5 is a block diagram of the memory control circuit of the first embodiment.

FIG. 5 shows the detailed arrangement of the memory control circuit MC. The memory control circuit includes a page access checking circuit PH, a mode change circuit MODE, an address generation circuit ACG which issues a control command and memory access address to the memory module, and an input/output data control circuit DQB which controls the data transaction with the memory module.

The page access checking circuit PH checks as to whether or not the row address of the previous memory access and the row address of the immediate memory access provided by the arbiter circuit ARB are equal. The mode change circuit MODE switches dynamically between the page-off mode for closing the page of memory following the access to the memory module and the page-on mode for retaining the page open.

The operation of the page access checking circuit PH and mode change circuit MODE will be explained with reference to FIG. 6 and FIG. 7. FIG. 6 shows the table held by the page access checking circuit PH, and it includes fields of a row address select signal PS and comparison row address TRAD for the four banks of the memory module MEM. The field of row address TRAD stores the row address of the previous access to each memory bank. The row address select signal PS at the high level or low level indicates respectively that a row address TRAD of a bank is selected or not selected. The signal PS is low if the page is closed or high if the page is kept open at the end of previous access to a memory bank.

FIG. 7A shows the operational timing of the page access checking circuit PH. The memory control circuit MC receives a read command R and memory address AD0 from the arbiter circuit ARB. The memory address AD0 includes a bank address IAD(BANK) for specifying a bank and a row address IAD(ROW) for specifying a word line, i.e., a page. The example shown in the figure is the case of a bank address IAD(BANK) of "1" and a row address IAD(ROW) of "38".

The page access checking circuit PH makes reference to the table of FIG. 6 to get comparison row address "5" for the bank address "1", and compares the input row address "38" with the comparison row address "5". The input row address is not equal to the comparison row address. Namely, the immediate access and previous access to bank #1 differ in row address, i.e., these accesses are to different pages. Consequently, a row address equality signal HT shown in FIG. 5 has a low level, and a row address inequality signal MSIG(1) for bank #1 is high, and it is put into the mode change circuit MODE. The PSO signal is high which is derived from the value of PS for bank #1. Due to the result of inequality of row address for bank #1, the comparison row address of bank #1 is altered from "5" to "38".

Next, another case of operation shown in FIG. 7B will be explained. This is the case of a bank address IAD(BANK) of "3" and a row address IAD(ROW) of "41" put into the memory control circuit MC.

The page access checking circuit PH makes reference to the table of FIG. 6 to get comparison row address "41" for bank #3, and compares the input row address "41" with the comparison row address "14". The input row address is equal to the comparison row address. Namely, the immediate access and previous access to bank #3 are equal in row address, i.e., these accesses are to the same page. Consequently, the row address equality signal HT is high and the row address inequality signal MSIG(3) for bank #3 is low. The PSO signal is high which is derived from the value of PS for bank #3. Due to the result of equality of row address for bank #3, the comparison row address of bank #3 is retained to be "41". The signal MSIG(*) (where * represents the bank number) is the row address inequality signal for bank #*, and it becomes low for an event of same page access or becomes high for an event of different page access.

The mode change circuit MODE includes mode switch circuits (PRJ0–PRJ3) for switching the control mode of individual banks. The mode switch circuit PRJ3 for bank #3 is made up of an access counter RC which counts the number of times of successive events of access to different pages and a switch circuit SW which switches the LPR(3) output signal between the high and low levels depending on the count value of the access counter RC. A high-level LPR(3) signal indicates the page-off mode, and a low-level LPR(3) signal indicates the page-on mode. The remaining mode switch circuits PRJ0–PRJ2, which are identical in arrangement to the PRJ3, switch the modes of bank #0 through bank #2. The page-on mode is to control the memory at an event of data read/write access to the memory module so that the page is kept open until the next access event takes place, and the page-off mode is to control the memory so that the page is closed at each event of access to the memory module. The RAS-down mode or page mode is equivalent to the page-on mode.

The access counter RC of the mode switch circuits PRJ0–PRJ3 can be preset by the CPU of the number of times of successive events of access to different pages. The CPU releases a counter preset command RSET and data of the number of times of successive access events to different pages. These preset command and data are delivered to the memory control unit MCU over the CO0 and AD0 buses in FIG. 1, and put into the mode switch circuits PRJ0–PRJ3 via the arbiter circuit ARB and preset to each access counter RC. Although the CPU presets the number of times of successive access events to different pages in this embodiment, this affair is not compulsory, but it can be preset from the outside of the data processing system or can be preset fixedly in the manufacturing process of the memory control unit.

Figure 8:
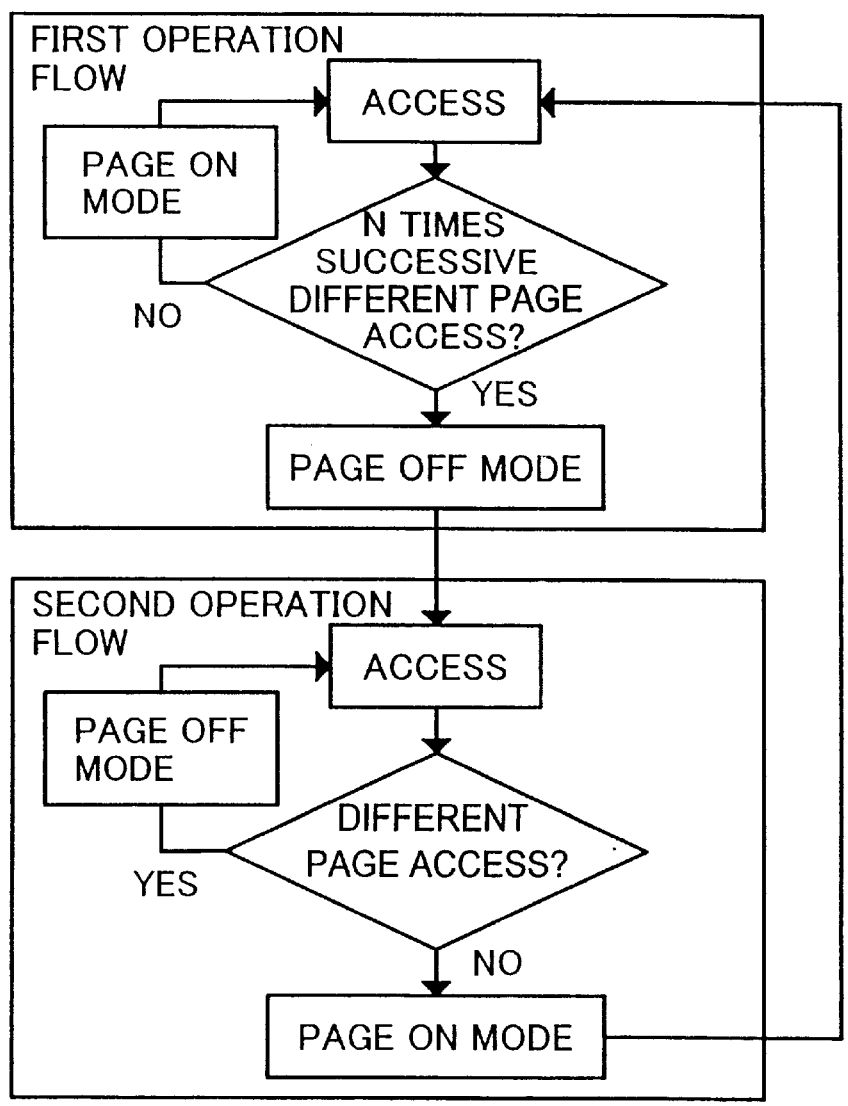
FIG. 8 is a flowchart showing the operation of the mode change circuit of the first embodiment.

FIG. 8 shows the operation of the mode switch circuits PRJ0–PRJ3. These circuits PRJ0–PRJ3 control memory banks #0–#3 correspondingly. The following explains the operation of the mode switch circuit PRJ3 for bank #3 as representative of the circuits PRJ0–PRJ3. The mode switch circuit PRJ3 is assumed to have preset value N of the number of times of successive access events to different pages in its access counter RC. The operation will be explained by being split into a first and second parts.

In the first part of operation, the page-on mode is assumed to be set already. A memory access request from the CPU is put into the memory control circuit MC via the arbiter circuit ARB. The page access checking circuit PH checks whether the input access address is of the same page as the previous access. The check result carried by the row address inequality signal MSIG(3) is put into the mode switch circuit PRJ3. The circuit PRJ3 checks whether there have been N-time successive high-level inputs, i.e., whether there have been successive access events to different pages equal in number to the value set in the access counter RC. If the number of high-level MSIG(3) inputs is less than N, the circuit PRJ3 produces a low-level LPR(3) output to retain the page-on mode. Otherwise, if the number reaches N, the circuit PRJ3 produces a high-level LPR(3) output to make switching to the page-off mode and precede to the second part of operation.

In the second part of operation, the mode switch circuit PRJ3 keeps the high-level LPR(3) output until a same page access arises, i.e., until the row address inequality signal MSIG(3) goes low, thereby retaining the page-off mode. When the MSIG(3) signal goes low, i.e., at an event of same page access, the circuit PRJ3 produces a low-level LPR(3) output to make switching to the page-on mode and return to the first part of operation. The mode switch circuit PRJ3 for bank #3, and also the remaining circuits PRJ0–PRJ2 for banks #0–#2, repeat these first and second parts of operation in response to events of memory access.

Figure 10:
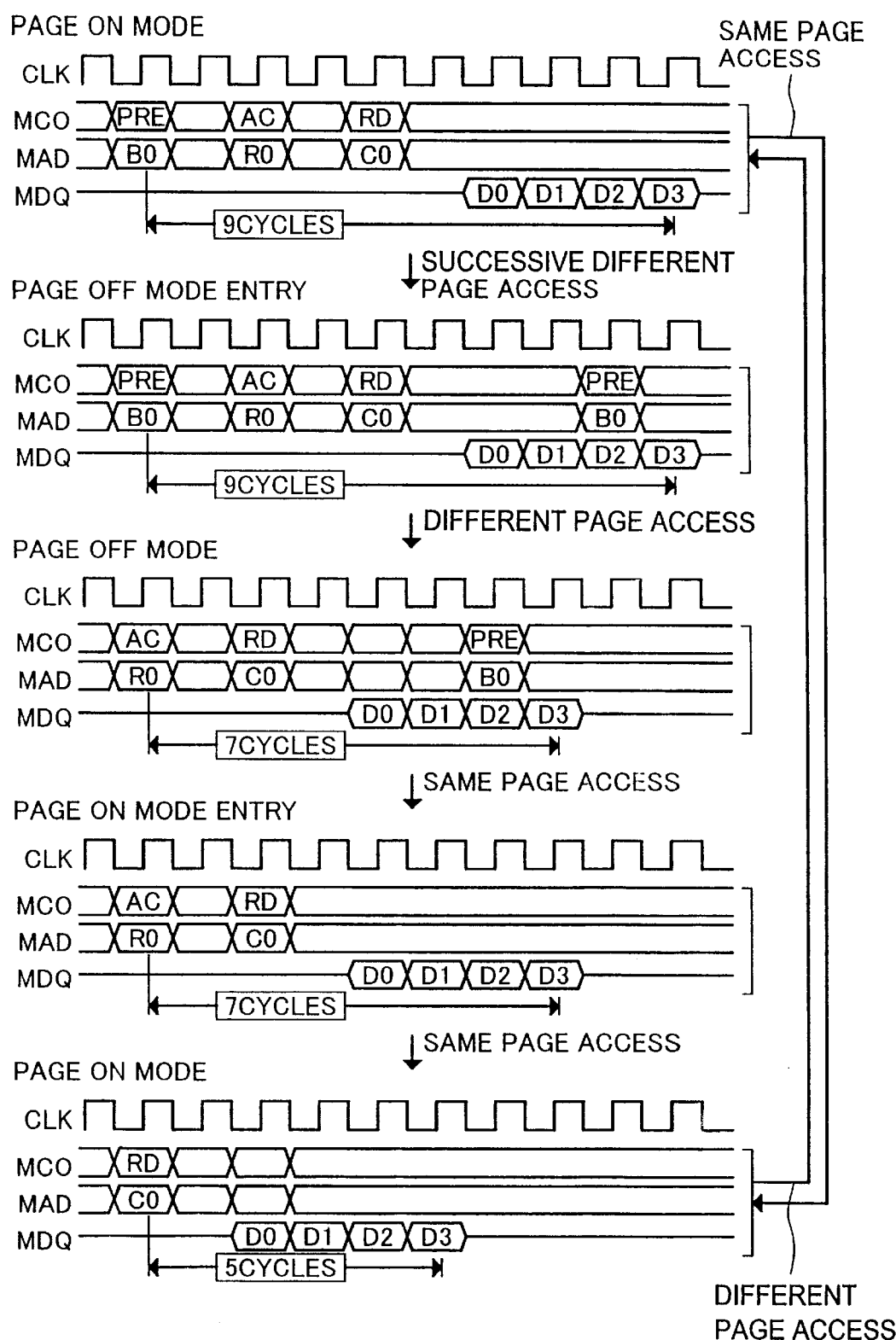
FIG. 10 is a set of timing charts showing the operation of the memory control circuit of the first embodiment.

FIG. 9 shows the operation of the address generation circuit ACG shown in FIG. 5, and FIG. 10 shows the signal waveforms at events of memory access in each mode. As shown in FIG. 5, the address generation circuit ACG receives the read command and memory address from the arbiter circuit ARB, a page access check signal HT and row address select signal PSO from the page access checking circuit PH, and an LPR signal from the mode change circuit MODE.

The LPR signal is low in the page-on mode, or it is high in the page-off mode. In the page-on mode, the precharge command PRE is not issued at the end of memory access, and the page is kept open. The following explains specifically the operation of cases (A) through (H) shown in FIG. 9.

(A) In case the row address select signal PS is high, the row address equality signal HT is high and the LPR signal is low, indicating that the page is selected already and the immediate access is to the same page, the memory control circuit puts out only the read command RD and column address CO to the memory module MEM. This memory read access for data transfer takes a latency of 5 cycles. This operation is shown by the timing chart at the bottom in FIG. 10.

(B) In case the row address select signal PS is low, the HT signal is high and the LPR signal is low, indicating that the page is not selected, the memory control circuit puts out the bank activate command AC and row address RO, and next the read command RD and column address CO to the memory module. The read latency for data transfer is 7 cycles. This access operation taking place at a transition from the page-off mode to the page-on mode is shown by the second timing chart from the bottom in FIG. 10.

(C) In case the row address select signal PS is high, the HT signal is low and the LPR signal is low, indicating an access event to a different page, the memory control circuit puts out the precharge command PRE, bank activate command AC and row address RO, and next the read command RD and column address CO to the memory module. The read latency for data transfer is 9 cycles. This access operation directed to a different page in the page-on mode is shown by the timing chart at the top in FIG. 10.

(D) In case the row address select signal PS is low, the HT signal is low and the LPR signal is low, indicating that the page is not selected, the memory control circuit puts out the bank activate command AC, and next the read command RD to the memory module. The read latency for data transfer is 7 cycles.

These operations (A)-(D) are of the page-on mode, and the following operations (E)-(H) are of the page-off mode. In the page-off mode, the precharge command PRE is issued at the end of memory access, and the memory module MEM has its page closed, i.e., the unselected state of word line is restored.

(E) In case the row address select signal PS is high, the HT signal is high and the LPR signal is high, indicating that the page is selected already and the immediate access is to the same page, the memory control circuit puts out the read command RD, column address and precharge command PRE to the memory module, and closes the page following the data output. The read latency for data transfer is 5 cycles.

(F) In case the row address select signal PS is low, the HT signal is high and the LPR signal is high, indicating that the page is not selected, the memory control circuit puts out the bank activate command AC and row address, the read command RD and column address, and the precharge command PRE sequentially to the memory module. The read latency for data transfer is 7 cycles.

(G) In case the row address select signal PS is high, the HT signal is low and the LPR signal is high, indicating that a page is selected already, but the immediate access is to a different page, the memory control circuit puts out the precharge command PRE, bank activate command AC and row address, the read command RD and column address, and the precharge command PRE sequentially to the memory module. The read latency for data transfer is 9 cycles. This access operation taking place at a transition from the page-on mode to the page-off mode is shown by the second timing chart from the top in FIG. 10.

(H) In case the row address select signal PS is low, the HT signal is low and the LPR signal is high, indicating that the page is not selected, the memory control circuit puts out the bank activate command AC and row address, the read command RD and column address, and the precharge command PRE sequentially to the memory module. The read latency for data transfer is 7 cycles. This access operation taking place in the succession of the page-off mode is shown by the third timing chart from the top in FIG. 10.

The values of write latency shown at the bottom of table in FIG. 9 are examples of the operation of the address generation circuit ACG at the input of a write command WT. At data writing to the memory module, the read command RD in the command sequence is replaced with the write command WT.

At an event of access to a different page in the page-on mode, the immediate page needs to be closed, i.e., it is done by making the selected word line unselected and issuing the precharge command PRE for precharging the data lines. In this case, the closed page must be opened again, and therefore the read latency becomes 9 cycles.

At successive access events to different pages, the page-on mode is switched to the page-off mode. At an access event to a different page in the page-off mode, the page is already closed in the previous access and the issuance of precharge command PRE at the beginning is not needed, resulting in a latency of 7 cycles.

At a transition from the page-on mode to the page-off mode, there is no necessity of having the continuation of different page access, and it is possible to have switching to the page-on mode at a single event of access to a different page in the page-on mode. This can be done by presetting the access counter RC to "1". It is also possible to make switching from the page-on mode to the page-off mode depending on the proportion of frequencies of same page access and different page access, instead of being responsive to successive access events to different pages. Further, in case of the page-on mode, it can be switched forcedly to the page-off mode by carrying out the procedure as shown in FIG. 9(E).

At an event of access to the same page in the page-off mode, the page-off mode is switched to the page-on mode. An access event to a same page in the page-on mode is to the page which is open currently, instead of needing another page to open, and the latency becomes 5 cycles. In this case also, the page-off mode can be switched forcedly to the page-on mode by carrying out the procedure as shown in FIG. 9(D). This means may be designed to make switching to the page-on mode following several times of page access events in the page-off mode, i.e., following the continuation of the state of (E) in FIG. 9. It is possible to provide a register similar to the access counter RC for setting the number of times of page access before switching to the page-on mode.

As described above, the present invention is designed to switch between the page-on mode and the page-off mode dynamically in response to individual access events, thereby enabling high-speed data transfer between the CPU and the memory module.

Figure 11:
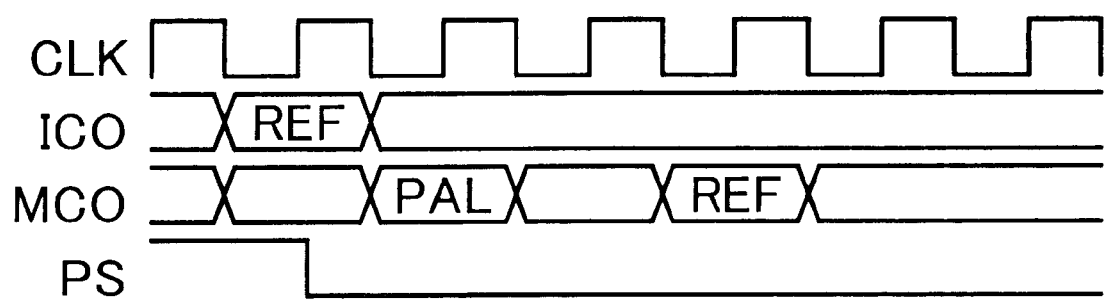
FIG. 11 is a timing chart showing the refresh operation of the first embodiment.

FIG. 11 shows the signal waveforms of operation when a refresh command is put into the memory control circuit MC. At the input of the refresh command, a precharge-all command PAL is issued to precharge all memory banks of the memory module, and thereafter a refresh command REF is issued. After all memory banks are precharged by the precharge-all command PAL, all row address select signals PS in the page access checking circuit PH are turned low.

Figure 12A:
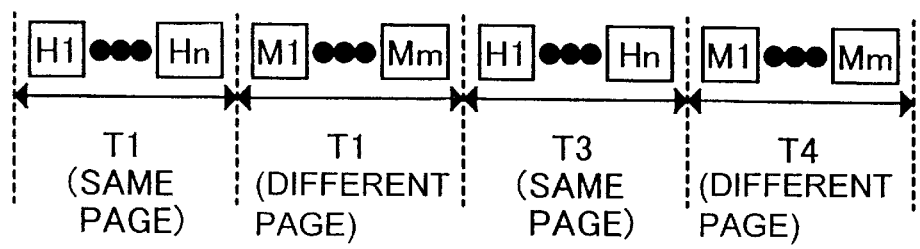
FIGS. 12A, 12B and 12C are diagrams showing the effectiveness of this invention.

FIG. 12A shows a typical example of access from the CPU to the memory module MEM. There is a case of successive access events to a same page and successive access events to different pages occurring alternately. Periods T1 and T3 are of successive access events to a same page and periods T2 and T4 are of successive access events to different pages.

Figure 12B:
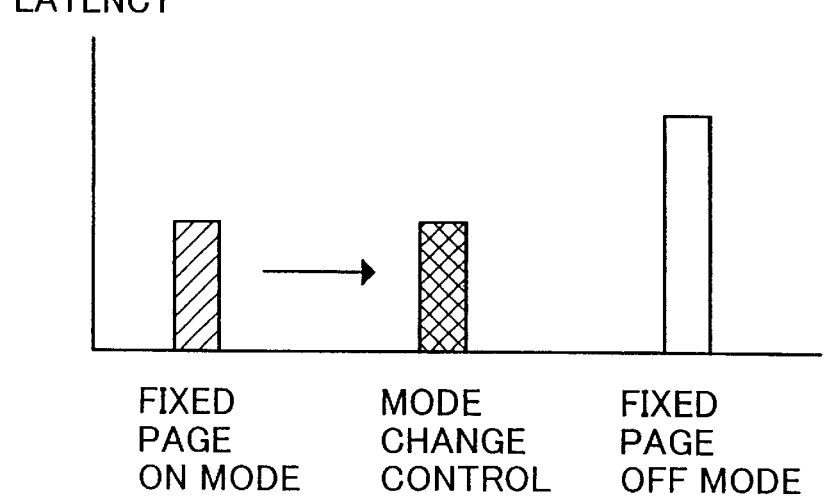
Figure 12C:
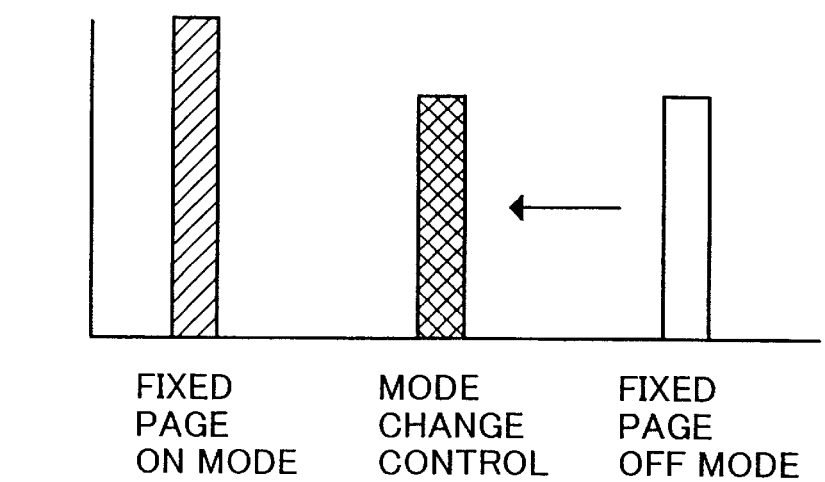

FIG. 12B compares the latencies among the operation fixed to the page-on mode, the operation fixed to the page-off mode, and the inventive mode switching operation in the periods T1 and T3 of successive access events to the same page. FIG. 12C compares the latencies among the operation fixed to the page-on mode, the operation fixed to the page-off mode, and the inventive mode switching operation in the periods T2 and T4 of successive access events to different pages. FIGS. 12B and 12C reveal that, according to this invention, the system operates in the page-on mode during the periods T1 and T3 of successive access events to the same page and operates by switching to the page-off mode during the periods T2 and T4 of successive access events to different pages.

Based on this mode switching, it becomes possible constantly to minimize the latency and make high-speed access to the memory module. Furthermore, it becomes possible to reduce the power consumption of the memories owing to the smaller number of times of operation of the sense amplifiers of the memories.

In the foregoing first embodiment, the memory module has a number of banks. However, the present invention is essentially capable of being applied to data processing systems in which memory modules do not have memory banks, and is capable of accomplishing high-speed access to the memories of these systems.

Figure 13:
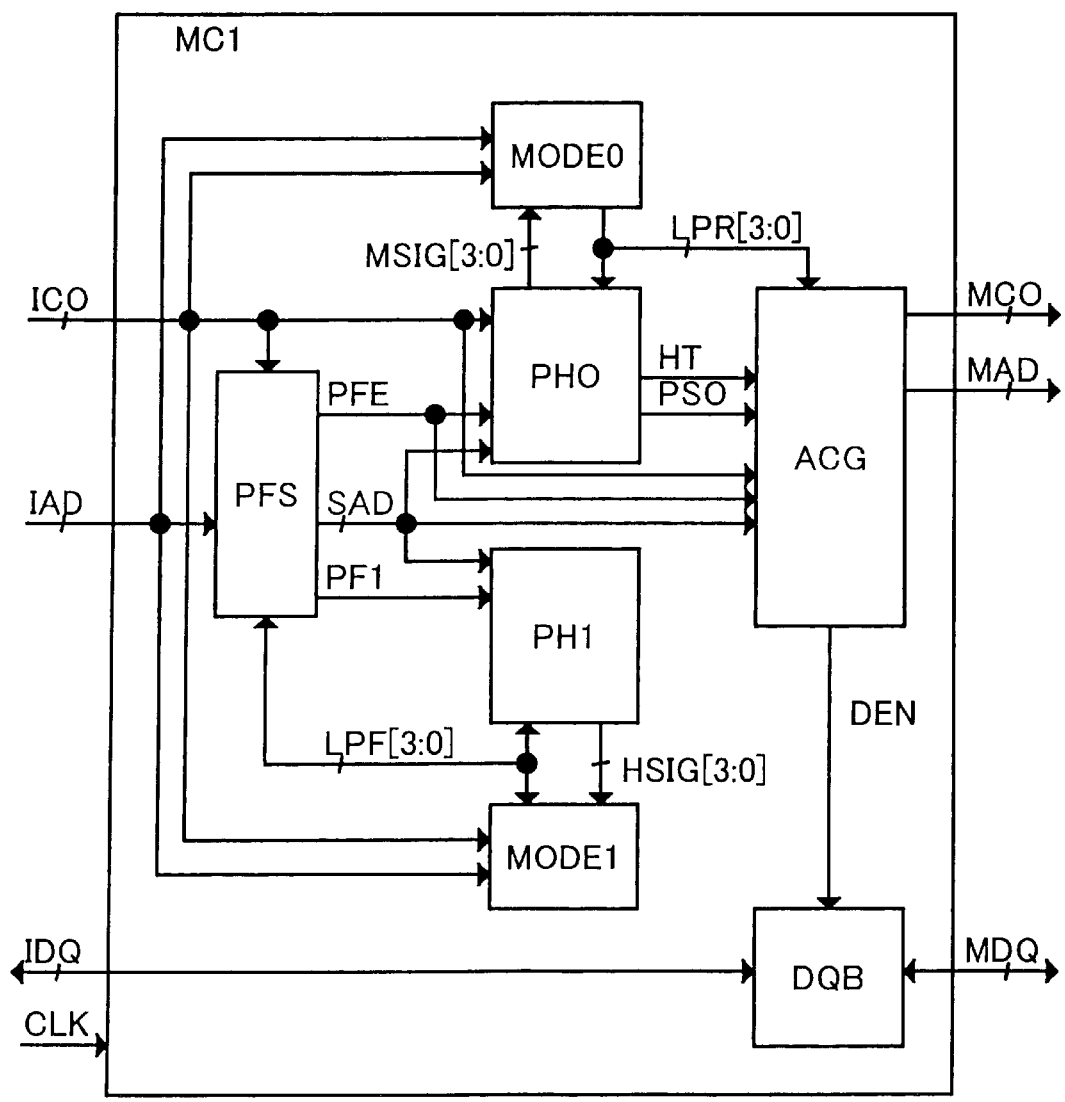
FIG. 13 is a block diagram of the memory control circuit based on a second embodiment of this invention.

FIG. 13 shows by block diagram the memory control circuit based on the second embodiment of this invention, with the names and symbols of items common to the first embodiment being used. Other constituents of data processing system which are identical to the first embodiment are not shown and explained repeatedly.

This memory control circuit MC1 includes a predicted address generation circuit PFS which issues the next address (the previous address added by a certain offset value) in advance based on the address provided by the arbiter circuit ARB. The memory control circuit further includes a mode change circuit MODE0 which checks as to whether or not the immediate access address is of the same page as the previous access thereby to switch dynamically between the page-off mode for closing the page of the memory module or the page-on mode for opening the page.

It further includes a page access checking circuit PH0 which checks whether or not the row address of the immediate access is equal to the row address of the previous access. It further includes a predicted address checking circuit PH1 which checks as to whether or not the row address that has been issued in advance by the predicted address generation circuit PFS is equal to the row address provided by the arbiter circuit ARB, and a predicted address generation mode change circuit MODE1 which validates or invalidates dynamically the predicted address generation in response to the result provided by the predicted address checking circuit PH1. It further includes an input/output data control circuit DQB which controls the data transaction with the memory module and an address generation circuit ACG which produces a control command and address for the memory module. The mode change circuit MODE0 and predicted address generation mode change circuit MODE1 operate in the same manner as the mode change circuit MODE of FIG. 5.

The operation of the predicted address generation circuit PFS and predicted address checking circuit PH1 will be explained.

FIG. 14 shows a table which belongs to the predicted address checking circuit PH1, in which are contained row addresses of individual banks of the memory module. Each row address is the comparison row address PRAD which has been issued by the predicted address generation circuit PFS before the immediate memory access.

FIG. 15 shows a table which belongs to the predicted address generation circuit PFS, in which are contained the valid signals PF for individual banks indicative of as to whether the predicted address to be put into the page access checking circuit PH0 is validated or invalidated. A high valid signal PF indicates valid, and a low PF signal indicates invalid.

Figure 16A:
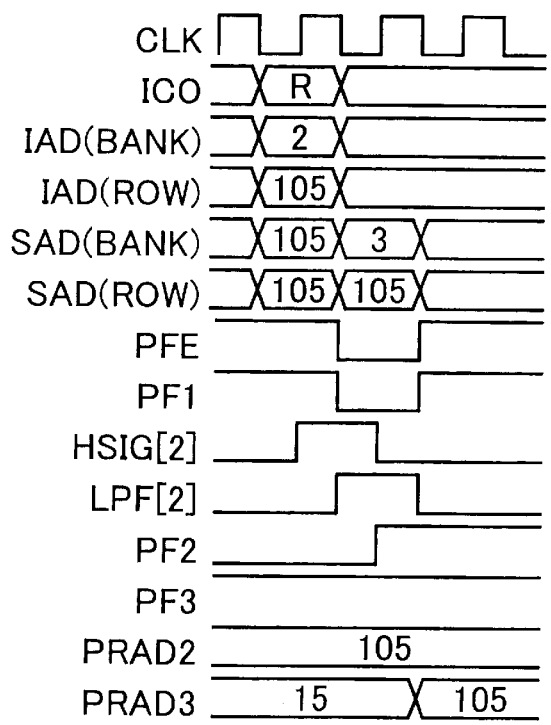
FIGS. 16A and 16B are timing charts showing the operation of the predicted address generation circuit and predicted address checking circuit of the second embodiment.
Figure 16B:
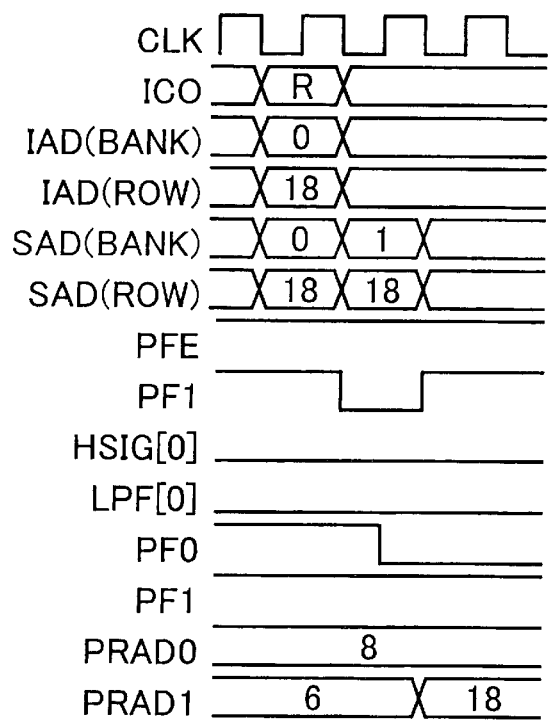

FIGS. 16A and 16B show an example of operation of the predicted address generation circuit PFS and predicted address checking circuit PH1. In FIG. 16A, the read command R, a bank address IAD(BANK) having value "2" and a row address IAD(ROW) having a value "105" are sent to the memory control circuit MC1 over the IC0 and the IAD buses. The predicted address generation circuit PFS responds to this address input to release a bank address SAD(BANK) having value "12", and a row address SAD(ROW) having value "105" to the predicted address checking circuit PH1 over the SAD bus.

The predicted address checking circuit PH1 compares the input row address value "105" with the comparison row address PRAD having value "105" of bank #2 in the table of FIG. 14. A result of equality of this case, indicative of same page access, produces a high-level HSIG(2) signal, and the value of PRAD of bank #2 is kept unchanged at "105".

Subsequently, the predicted address generation circuit PFS puts out a predicted bank address SAD(BANK) having value "3" and row address SAD (ROW) having value "105" to the predicted address checking circuit PH1 over the SAD bus. It also puts out a low PFE signal to the page access checking circuit PH0.

The predicted address checking circuit PH1 revises the value "15" of comparison row address PRAD of bank #3 to the value "105" of input predicted row address SAD(ROW) in the table of FIG. 14. Since the predicted bank address SAD(BANK) provided by the predicted address generation circuit PFS over the SAD bus has value "3", the valid signal PF for bank #3 in the table of FIG. 15 is read out. This valid signal PF is high, causing the predicted address to be validated, and the PFE signal is turned low.

The LPF(0–3) signal released by the predicted address generation mode change circuit MODE1 to the predicted address generation circuit PFS is correspondent to individual memory banks, and this signal is used to set the valid signal PF to high or low. A high LPF signal bit signifies the validation of predicted address, and a low LPF signal bit signifies the invalidation of the predicted address. With LPF(2) being high, the valid signal PF has its bit for bank #2 set to high.

In FIG. 16B, the read command R, a bank address IAD(BANK) having value "0" and a row address IAD (ROW) having a value "18" are put into the memory control circuit MCI over the IC0 and IAD buses. The predicted address generation circuit PFS responds to this address input to release a bank address SAD(BANK) having value "0" and a row address SAD(ROW) having value "18" to the predicted address checking circuit PH1 over the SAD bus.

The predicted address checking circuit PH1 compares the input row address value "18" with the comparison row address PRAD with value "8" of bank #0 in the table of FIG. 14. A result of inequality of this case, produces a low-level HSIG(0) signal, and the value of comparison row address PRAD of bank #0 is kept unchanged at "8".

Subsequently, the predicted address generation circuit PFS puts out a predicted bank address SAD(BANK) having value "1" and a row address SAD (ROW) having value "18" to the predicted address checking circuit PH1. It also puts out a low PF1 signal to the predicted address checking circuit PH1.

The predicted address checking circuit PH1 revises the value "6" of comparison row address PRAD of bank #1 to the value "18" of predicted row address SAD(ROW) in the table of FIG. 14. Since the predicted bank address SAD (BANK) provided by the predicted address generation circuit PFS over the SAD bus has value "1", the valid signal PF for bank #1 is read out. This valid signal PF is low, causing the predicted address to be invalidated, and the PFE signal is turned high. The low LPF(1) signal causes the valid signal PF1 for bank #1 of the valid signal PF to be set to low.

Figure 17:
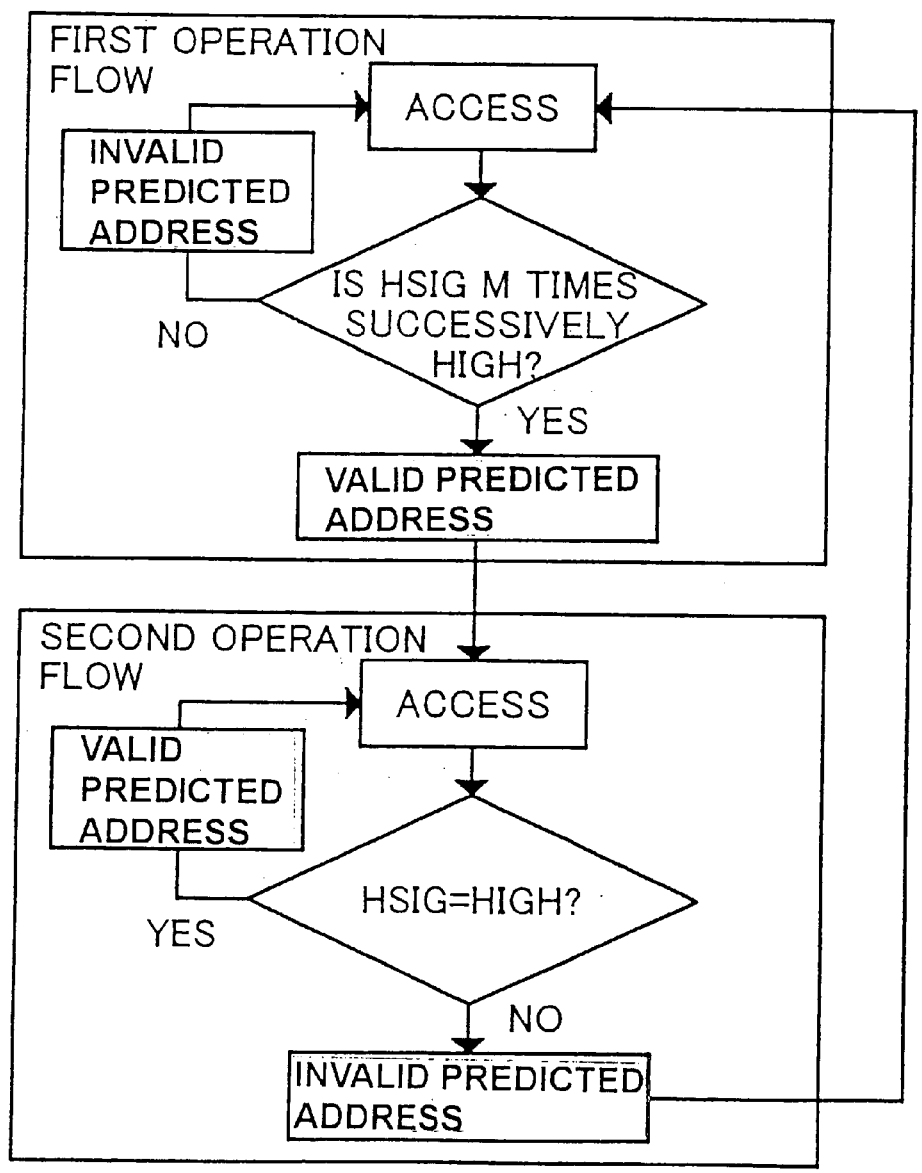
FIG. 17 is a flowchart showing the predicted address generation mode change circuit of the second embodiment.

FIG. 17 shows the operation of the predicted address generation mode change circuit MODE1. The circuit MODE1 is identical in arrangement and operation to the mode change circuit MODE shown in FIG. 2. The operation will be explained by being split into a first and second parts.

The circuit MODE1 responds to each input of memory address from the arbiter circuit ARB to check as to whether there have been M-time successive outputs of high-level HSIG signal. If there have not been M-time successive outputs of high HSIG signal, the LPF signal is made low to retain the predicted address invalid mode. If there have been M-time successive outputs of high-level HSIG signal, the LPF signal is turned high to make switching to the predicted address valid mode and precede to the second part of operation.

In the second part of operation, the circuit MODE1 keeps the predicted address valid mode and the high LPF signal until the HSIG signal turns low. When the HSIG signal turns low, the LPF signal is turned low to make switching to the predicted address invalid mode and return to the first part of operation. This control operation is repeated.

Figure 18A:
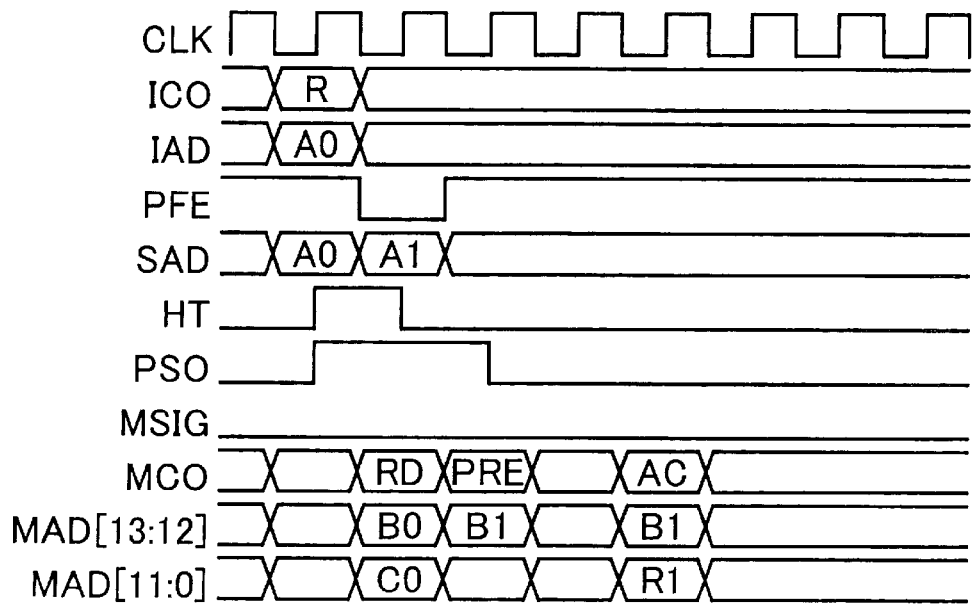
FIGS. 18A and 18B are timing charts showing the operation of the page access checking circuit and address generation circuit of the second embodiment.
Figure 18B:
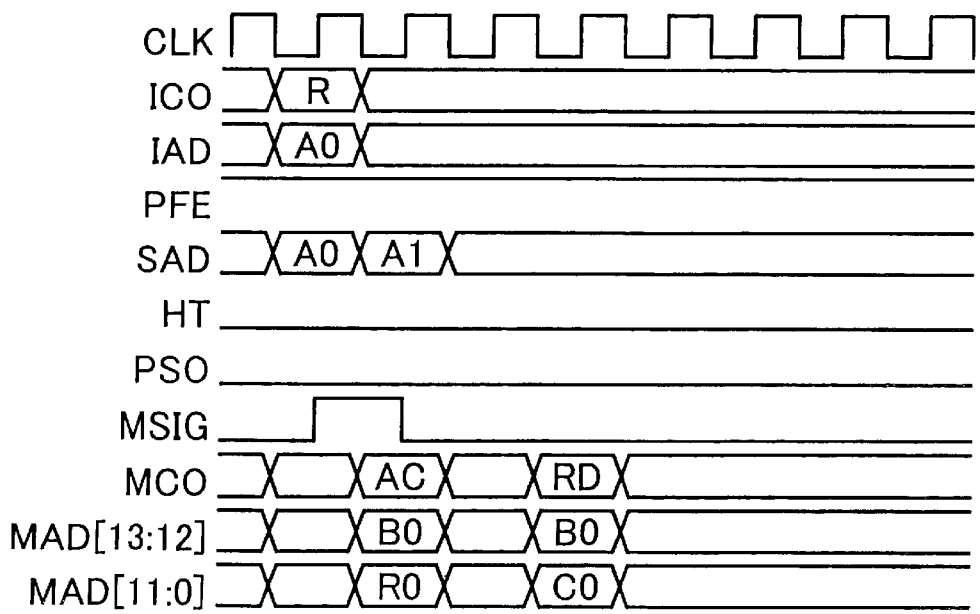

FIGS. 18A and 18B show the operation of the page access checking circuit PH0 and address generation circuit ACG. In FIG. 18A, the read command R and address A0 are sent to the memory control circuit MC1 over the IC0 bus and IAD bus, respectively. The predicted address generation circuit PFS responds to this address input to send the address A0 and predicted address A1 to the page access checking circuit PH0 over the SAD bus. The page access checking circuit PH0 recognizes the address A0 to be of same page access, producing a high HT signal, low MSIG signal and high PS0 signal. The predicted address A1 is recognized to be valid by the low PFE signal, and it is to be checked as for page access by the page access checking circuit PH0. Consequently, it is recognized to be of different page access, resulting in a low HT signal and high PS0 signal.

The address generation circuit ACG receives the read command for the address A0 from the page access checking circuit PH0 and the HT, PS0 and PFE signals from the predicted address generation circuit PFS, and it sends the read command RD, bank address B0 and column address C0 for the address A0 to the memory module. For the predicted address A1, it sends the precharge command PRE, bank activate command AC, bank address B1 and row address R1 to the memory module.

In FIG. 18B, in response to the input of the read command R over the IC0 bus and address A0 over the IAD bus to the memory control circuit MC1, the predicted address generation circuit PFS sends the address A0 and predicted address A1 to the page access checking circuit PH0 over the SAD bus. The page access checking circuit PH0 recognizes the address A0 to be of different page access, producing a low HT signal, high MSIG signal and low PS0 signal. The predicted address A1 is recognized to be invalid by the high PFE signal, and it is not to be checked as for page access by the page access checking circuit PH0.

The address generation circuit ACG receives the read command for the address A0 from the page access checking circuit PH0 and the HT, PS0 and PFE signals from the predicted address generation circuit PFS, and it sends the bank activate command AC, read command RD, bank address B0, row address R0, and column address C0 for the address A0 to the memory module. For the predicted address A1, it sends nothing.

Figure 19:
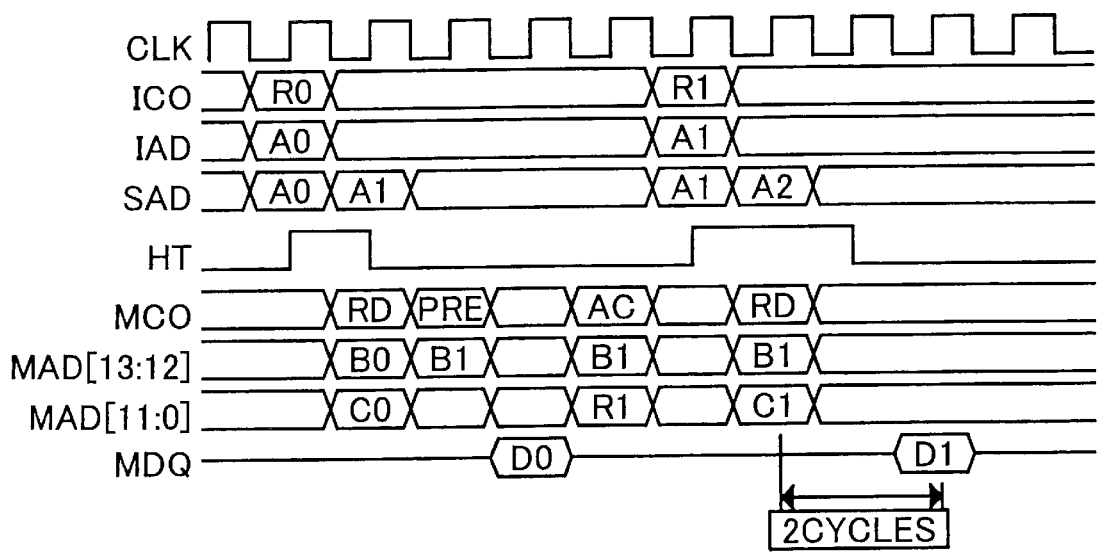
FIG. 19 is a timing chart showing the operation of the memory control circuit of the second embodiment.

FIG. 19 explains the overall operation of the memory control circuit MC1. The read command R0 and address A0 are put into the predicted address generation circuit PFS over the IC0 bus and IAD bus, respectively. The predicted address generation circuit PFS first issues the address A0 and next issues the predicted address A1 over the SAD bus. The predicted address A1 is of a bank different from that of the address A0. The address A0 is put into the page access checking circuit PH0.

If the circuit PH0 recognizes the input row address to be equal to the comparison row address, i.e., both addresses are of the same page, it produces a high HT signal as in the case of the first embodiment. The address generation circuit ACG sends the read command RD, bank address B0 and column address C0 to the memory module. The predicted address A1 is put into it the page access checking circuit PH0 after the address A0. The page access checking circuit PH0 recognizes the input row address to be different from the comparison address, causing the HT signal to turn low, and the address generation circuit ACG produces the precharge command PRE thereby to hold the data of the predicted address in the DRAM sense amplifier and puts out the bank activate command AC, bank address B1 and row address R1.

Subsequently, when the record command R1 and address A1 are put into the predicted address generation circuit PFS over the IC0 and IAD, respectively, the circuit PFS first issues the address A1 and next issues the predicted address A2 over the SAD bus. Since the row address for the address A1 has been selected by the previous address AO, the HT signal is high and the intended data is delivered to the memory module at a minimal latency of 2 cycles. Based on the advanced issuance of the next address in this manner, the access frequency to the same page increases, and the access to the memory module can be sped up.

Figure 20:
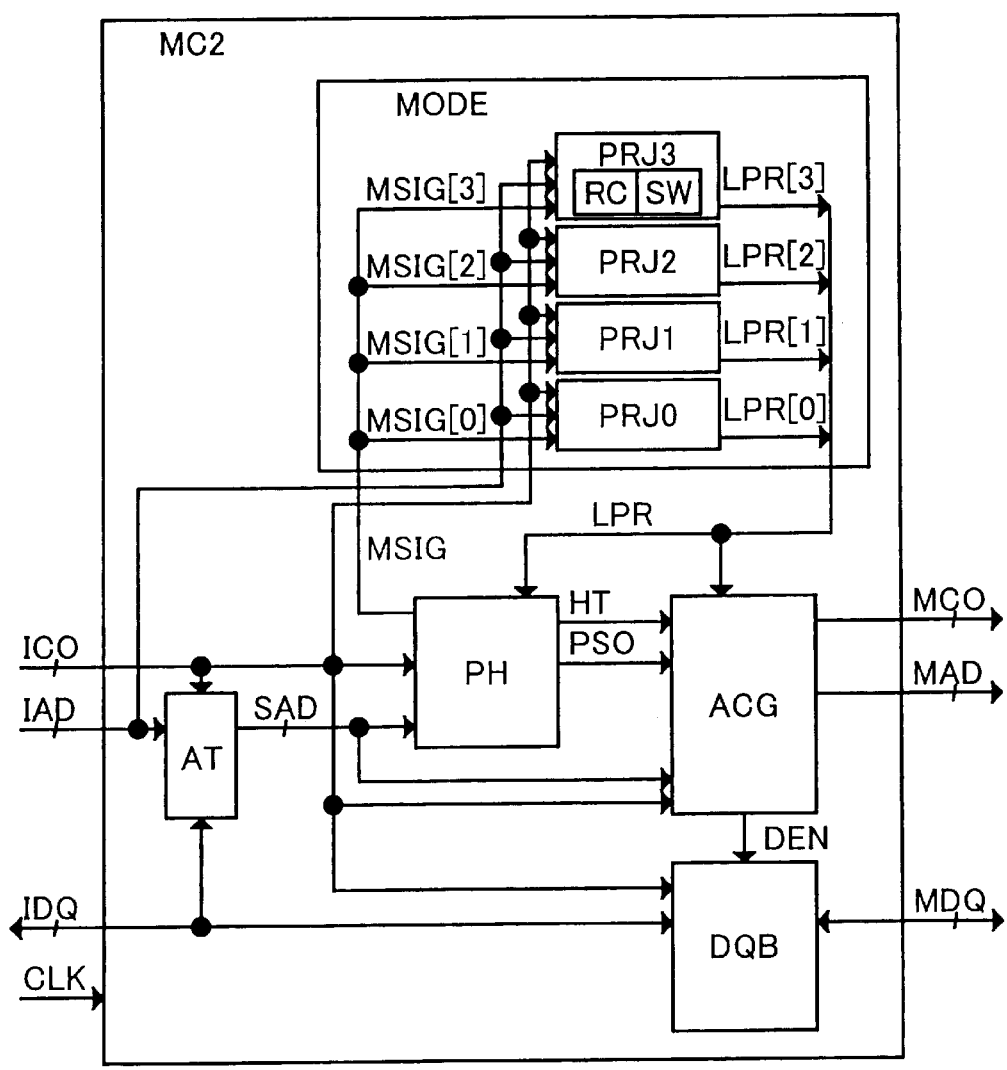
FIG. 20 is a block diagram of the memory control circuit based on a third embodiment of this invention.

FIG. 20 shows by block diagram the memory control circuit based on the third embodiment of this invention. This circuit MC2 is derived from the memory control circuit MC of the first embodiment, with an automatic address alignment circuit AT being added thereto.

Figure 21:
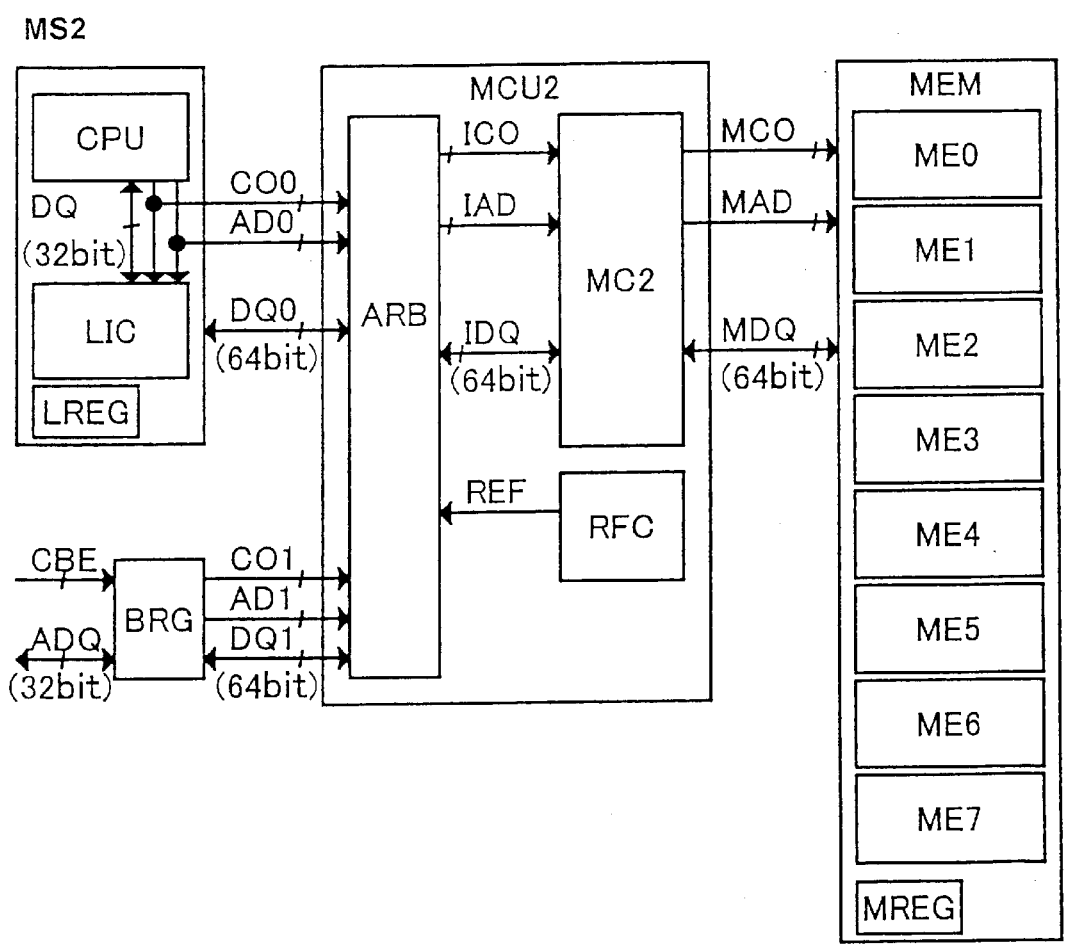
FIG. 21 is a block diagram of the data processing system based on the third embodiment of this invention.

FIG. 21 shows by block diagram the data processing system which includes the memory control circuit MC2. The data processing system is made up of a memory module MEM, a data processor MS2 having a CPU which makes access to the memory module and primary cache L1C, a PCI bridge circuit BRG, and a memory control circuit MCU2 which controls the memory module MEM.

The memory module MEM is derived from the one shown in FIG. 1 with the addition of a module status register MREG for holding module status information including the bank address, row address and column address indicative of the structure of memory module. The data processor MS2 is derived from the one shown in FIG. 1 as MS0 with the addition of a cache status register LREG for holding cache status information including the tag, index and line size indicative of the structure of primary cache.

The operation for transferring the cache status information held by the cache status register LREG and module status information held by the module status register MREG to the automatic address alignment circuit AT will be explained in connection with FIG. 20 and FIG. 21.

The cache status information is transferred from the cache status register LREG to the automatic address alignment circuit AT as follows. The CPU sends over the CO0 and IC0 buses a command WC of transferring the cache status information held by the cache status register LREG to the memory control circuit, and sends the cache status information to the automatic address alignment circuit AT in the memory control circuit over the DQ0 and IDQ buses. The number of bits of line is sent over the IDQ(4–0) lines, the number of bits of index is sent over the IDQ(9–5) lines, and the number of bits of tag is sent over the IDQ(14–10) lines to the automatic address alignment circuit AT. By the transfer command WC, the cache status information is put into the register CREG in the automatic address alignment circuit AT.

Subsequently, the CPU sends over the CO0 and IC0 buses a command of transferring the module status information held by the module status register MREG to the memory control circuit. The address generation circuit ACG in the memory control circuit sends a command of reading the module status information out of the module status register MREG to the memory module. Consequently, the module status information is sent from the memory module to the register in the automatic address alignment circuit over the MDQ and IDQ buses.

Figure 22:
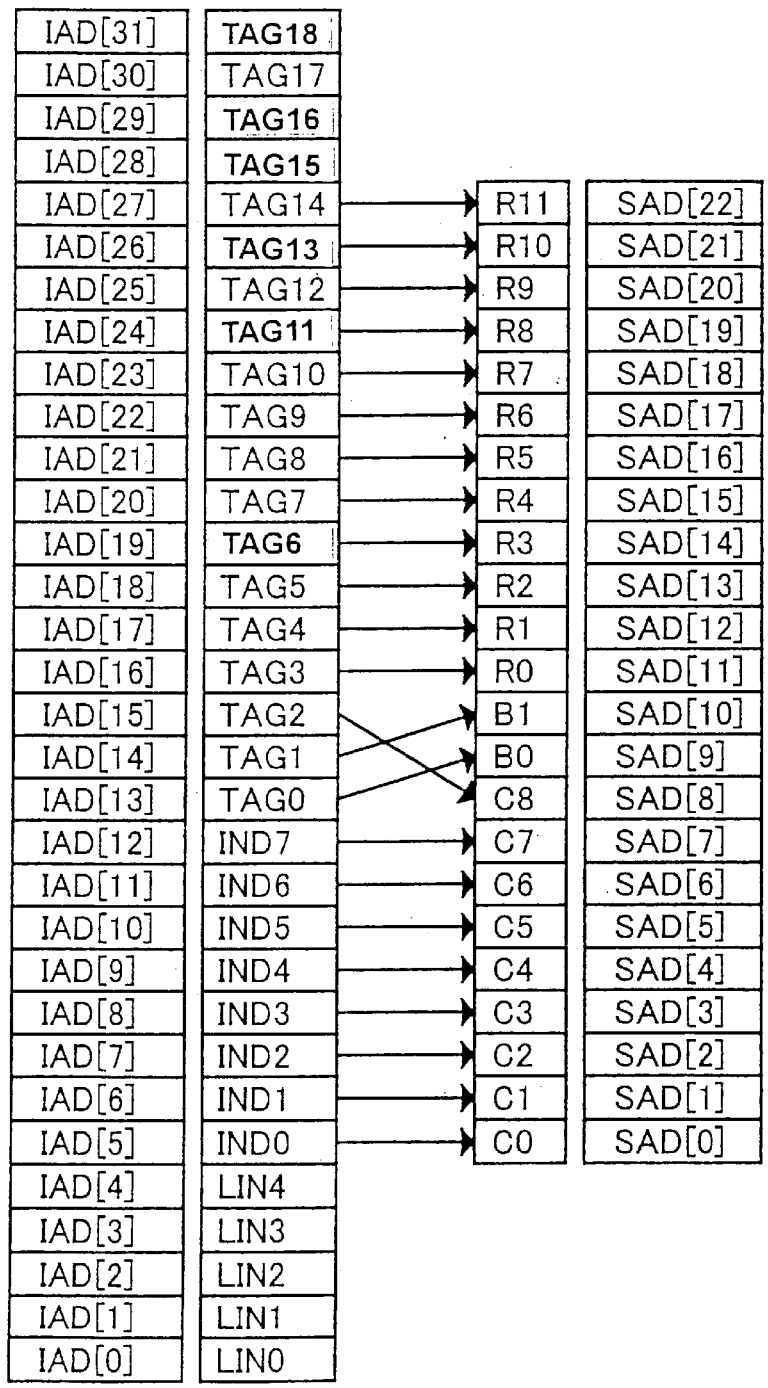
FIG. 22 is a diagram showing address alignment conducted by the automatic address alignment circuit of the third embodiment.

FIG. 22 shows an example of operation of the automatic address alignment circuit AT of the case of the primary cache L1C with a line size of 5 bits, an index size of 8 bits and a tag size of 19 bits, and of the memory module MEM with a column address of 9 bits, a bank address of 2 bits and a row address of 12 bits. The IAD(31–0) is the address which is put into the automatic address alignment circuit AT, and SAD (22–0) is the address which is released by being treated by the automatic address alignment circuit AT.

Indicated by LIN0–LIN4 are 5-bit lines, IND0–IND7 are an 8-bit index, and TAG0–TAG18 are a 19-bit tag. C0–C8 are a 9-bit column address, B0–B1 are a 2-bit bank address, and R0–R11 are a 12-bit row address. The 5-bit lines, 8-bit index and 19-bit tag are first assigned sequentially from the lowest bit of IAD(31–0), and next the 9-bit column address, 2-bit bank address and 12-bit row address are assigned sequentially from the lowest bit of SAD(22–0). Subsequently, the bank address is assigned from the lowest bit of tag.

Figure 23:
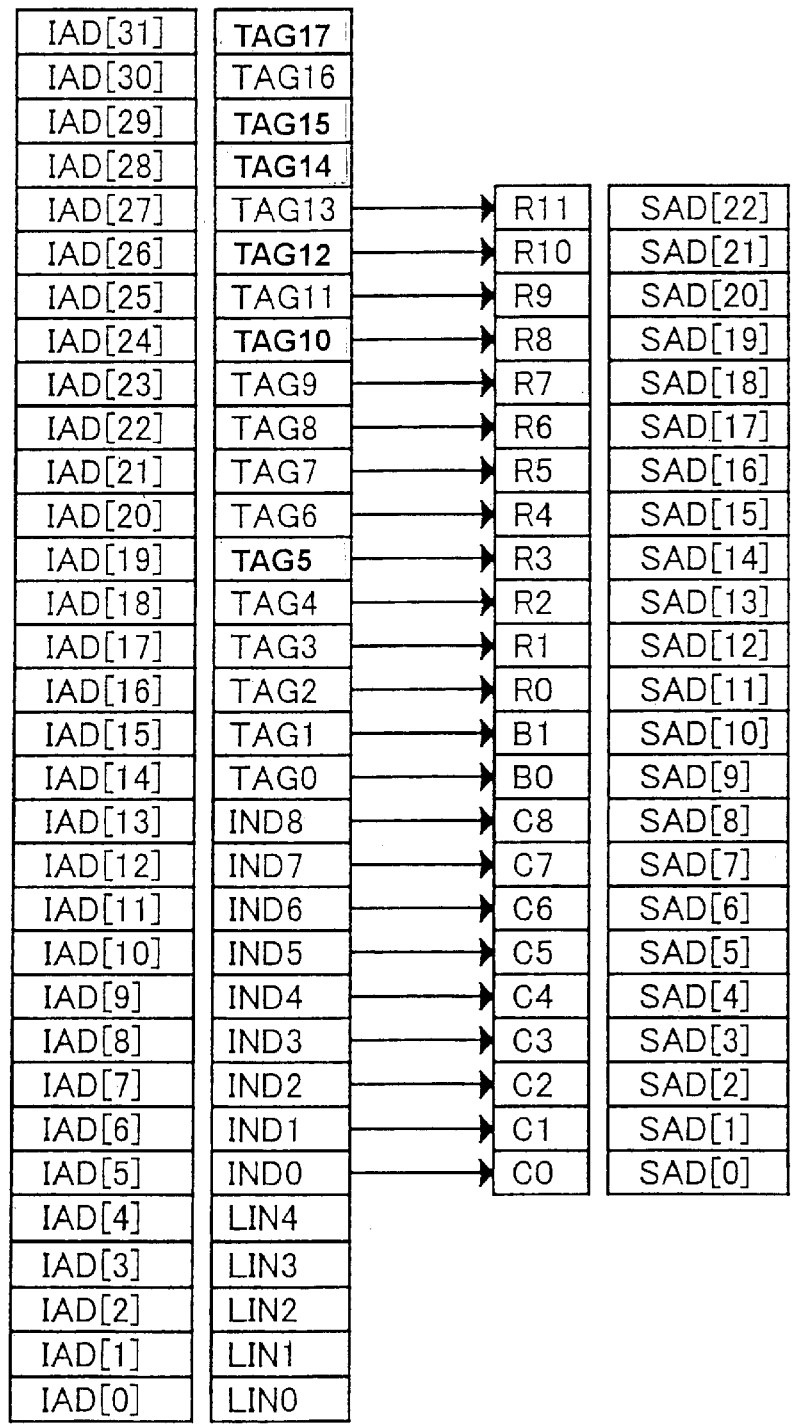
FIG. 23 is a diagram showing address alignment conducted by the automatic address alignment circuit of the third embodiment.

FIG. 23 shows another example of operation of the automatic address alignment circuit AT of the case of the primary cache L1C with a line size of 5 bits, an index size of 9 bits and a tag size of 18 bits, and of the memory module MEM with a column address of 9 bits, a bank address of 2 bits and a row address of 12 bits. The IAD(31–0) is an address which is put into the automatic address alignment circuit AT, and SAD(22–0) is an address which is released by being treated by the automatic address alignment circuit AT.

Indicated by LIN0–LIN4 are 5-bit lines, IND0–IND8 are a 9-bit index, and TAG0–TAG17 are a 18-bit tag. C0–C8 are a 9-bit column address, B0–B1 are a 2-bit bank address, and R0–R11 are a 12-bit row address. The 5-bit lines, 9-bit index and 18-bit tag are assigned first sequentially from the lowest bit of IAD (31–0), and next the 9-bit column address, 2-bit bank address and 12-bit row address are assigned sequentially from the lowest bit of SAD(22–0). Subsequently, the bank address is assigned from the lowest bit of tag.

Based on the automatic assignment of the bank address to the tag bits so that the read operation for replacing the cache entry caused by the error of primary cache and the write operation for write-back take place in different banks, thereby lowering the frequency of operation of different pages in the same bank, it becomes possible to speed up the operation of the DRAM and synchronous DRAM.

Figure 24:
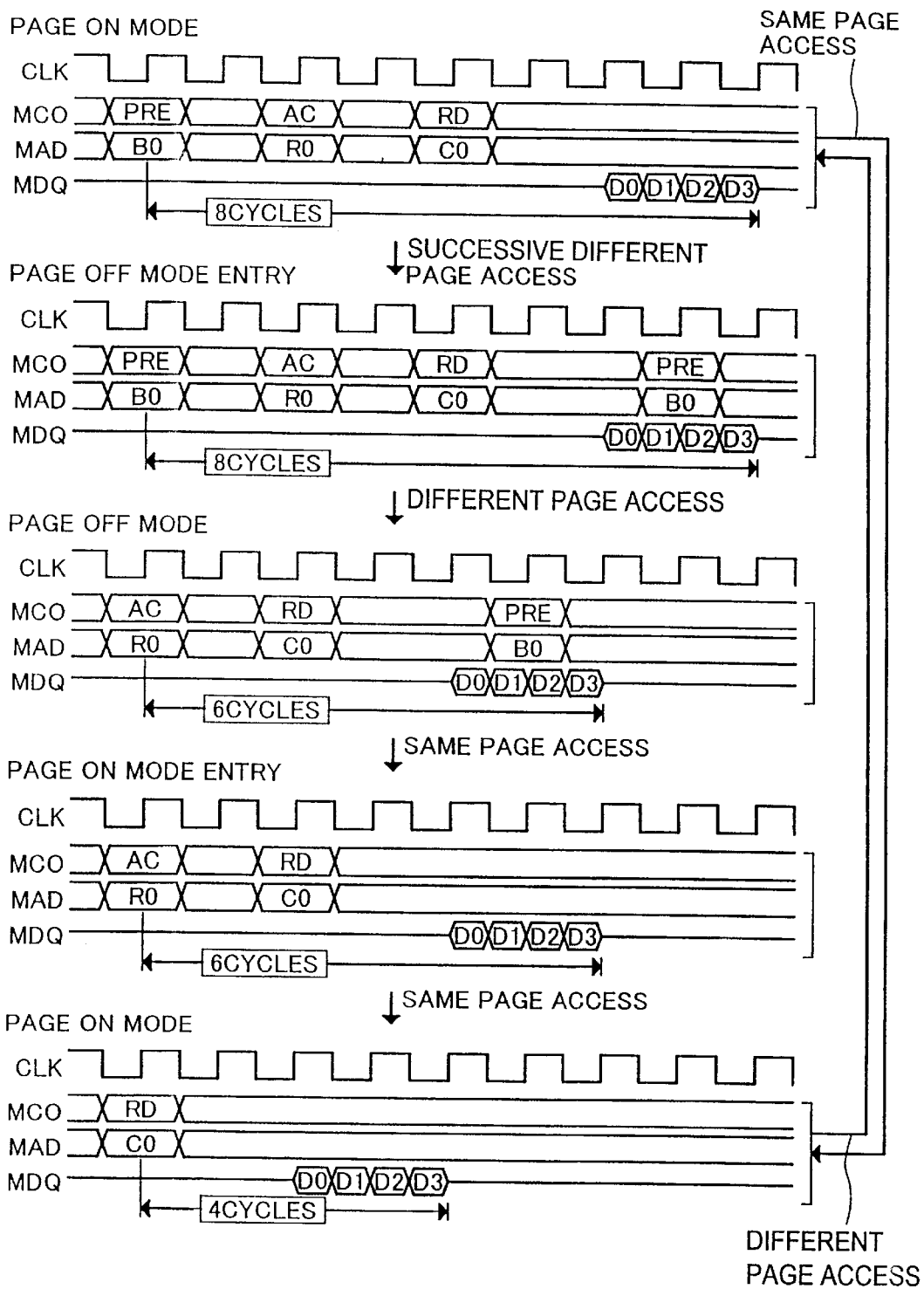
FIG. 24 is a set of timing charts showing the operation of a fourth embodiment of this invention.

FIG. 24 shows a set of timing charts showing the operation of the fourth embodiment of this invention, in which the memory module of FIG. 1 is formed of a DDR (double data rate) synchronous DRAM. The DDR-SDRAM has multiple memory banks and associated sense amplifiers as in the case of the SDRAM. The DDR-SDRAM features the data transfer at the rising and falling edges of the clock signal. The arrangement of this embodiment is virtually identical to the first embodiment, and its explanation and illustration will be omitted. This embodiment enables the high-speed operation of the DDR-SDRAM.

Shown in FIG. 24 are read latencies of the operational waveforms of the commands and addresses put out by the memory control circuit MC to the memory module MEM and data read out of the memory module in response to the input of the read command R to the memory control circuit MC in various modes switched by the memory control circuit MC.

At an event of different page access in the page-on mode, the precharge command PRE is issued to close the page which is open currently and next another page is opened, resulting in a read latency of 8 cycles. At successive events of different page access, the page-on mode is switched to the page-off mode. The issuance of precharge command PRE at the beginning is not needed, since the page has been closed in the previous access, resulting in a read latency of 6 cycles. At an event of same page access in the page-off mode, the mode is switched to the page-on mode. The same page access in the page-on mode is to the page which is open, instead of having to open another page, resulting in a latency of 4 cycles. Based on the mode switching control for the memory module of DDR-SDRAM, the memory module access can be sped up.

Figure 25:
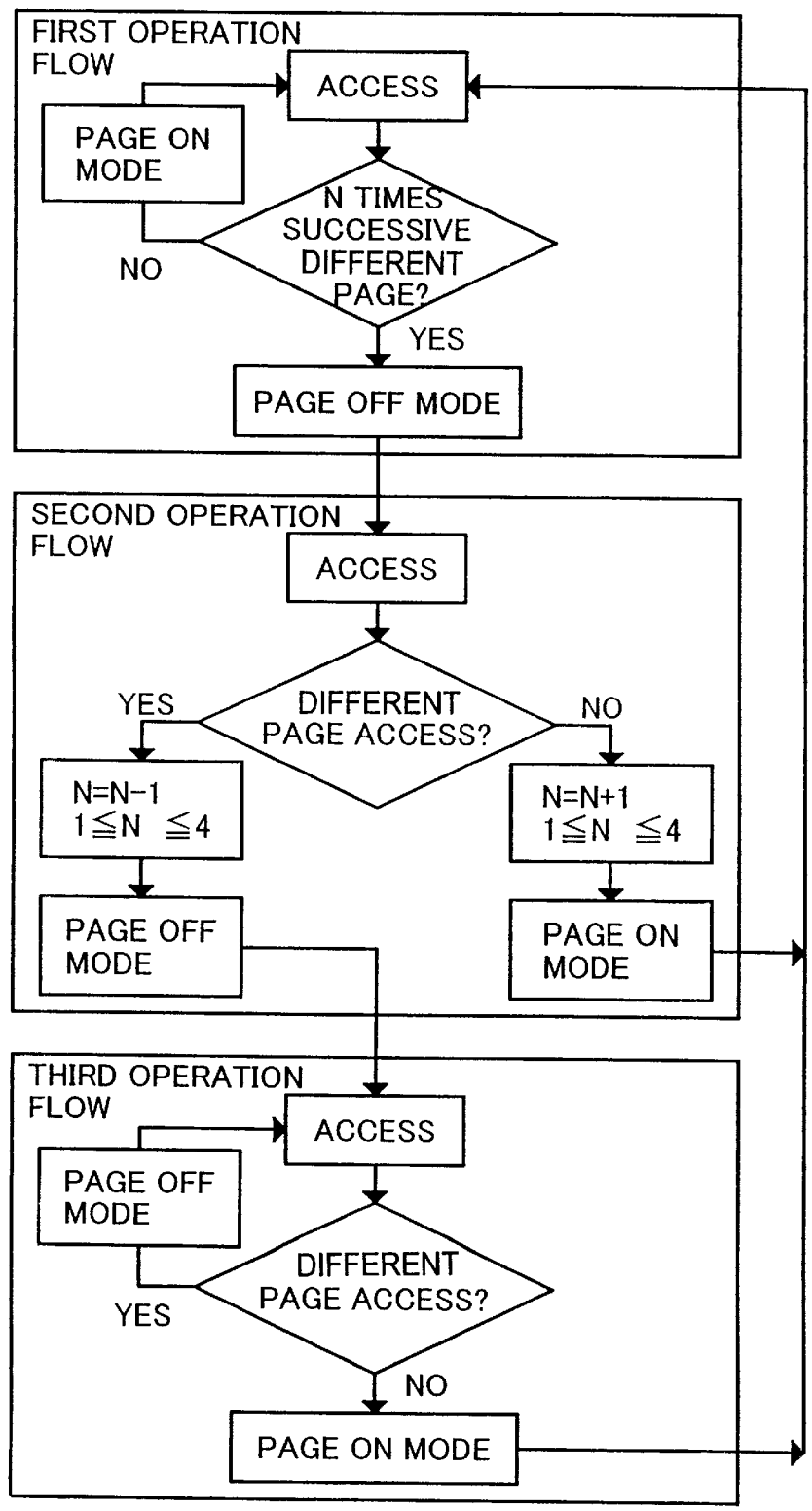
FIG. 25 is a flowchart showing the operation of the mode change circuit of the fourth embodiment.

FIG. 25 shows the operation of the mode change circuit based on the fourth embodiment. This mode change circuit has the same arrangement as the mode change circuits (PRJ0–PRJ3) of the first embodiment shown in FIG. 5, with common symbols being used in both figures. The following explains the mode change circuit PRJ3 which controls bank #3 out of four banks of the DDR-SDRAM. The mode switch circuit PRJ3 is assumed to have preset value N of the number of times of consecutive access events to different pages in its access counter RC. The operation will be explained by being split into three parts.

In the first part of operation, the page-on mode is assumed to be set already. A memory module access request from the CPU is put into the memory control circuit MC via the arbiter circuit ARB. The page access checking circuit PH checks whether the input access address is of the same page. The check result carried by a row address inequality signal MSIG(3) is put into the mode switch circuit PRJ3. The circuit PRJ3 checks whether there have been N-time successive high-level inputs, i.e., whether there have been successive events of different page access equal in number to the value set in the access counter RC. If the number of high-level MSIG(3) inputs is less than N, the circuit PRJ3 produces a low-level LPR(3) output to retain the page-on mode. If the number of successive high-level MSIG(3) inputs reaches N, the circuit PRJ3 produces a high-level LPR(3) output to switch to the page-off mode, and precedes to the second part of operation.

In the second part of operation, the mode switch circuit PRJ3 in the state of page-off mode checks whether the MSIG(3) signal is high. If the row address inequality signal MSIG(3) is low, i.e., if it is same page access, the circuit PRJ3 increments the value N of the access counter RC by one, turns the LPR(3) output to the low level, and returns to the first part of operation. If the MSIG(3) signal is high, indicative of different page access, the circuit PRJ3 decrements the value N of the access counter RC by one and keeps the LPR(3) output high to retain the page-off mode.

In the third part of operation, the LPR(3) output is kept high until a same page access arises after the page-off mode has been retained in the second part of operation, i.e., until the row address inequality signal MSIG(3) goes low, thereby retaining the page-off mode. When the MSIG(3) signal turns low, i.e., it becomes same page access, the circuit PRJ3 turns the MSIG(3) output to the low level to switch to the page-on mode, and returns to the first part of operation.

The second part of operation enables sophisticated mode switching, and the further speed-up of the data processing system is made possible. The principle of the second embodiment can be applied to other embodiments, inclusive of its application to the operation shown in FIG. 17.

Figure 26:
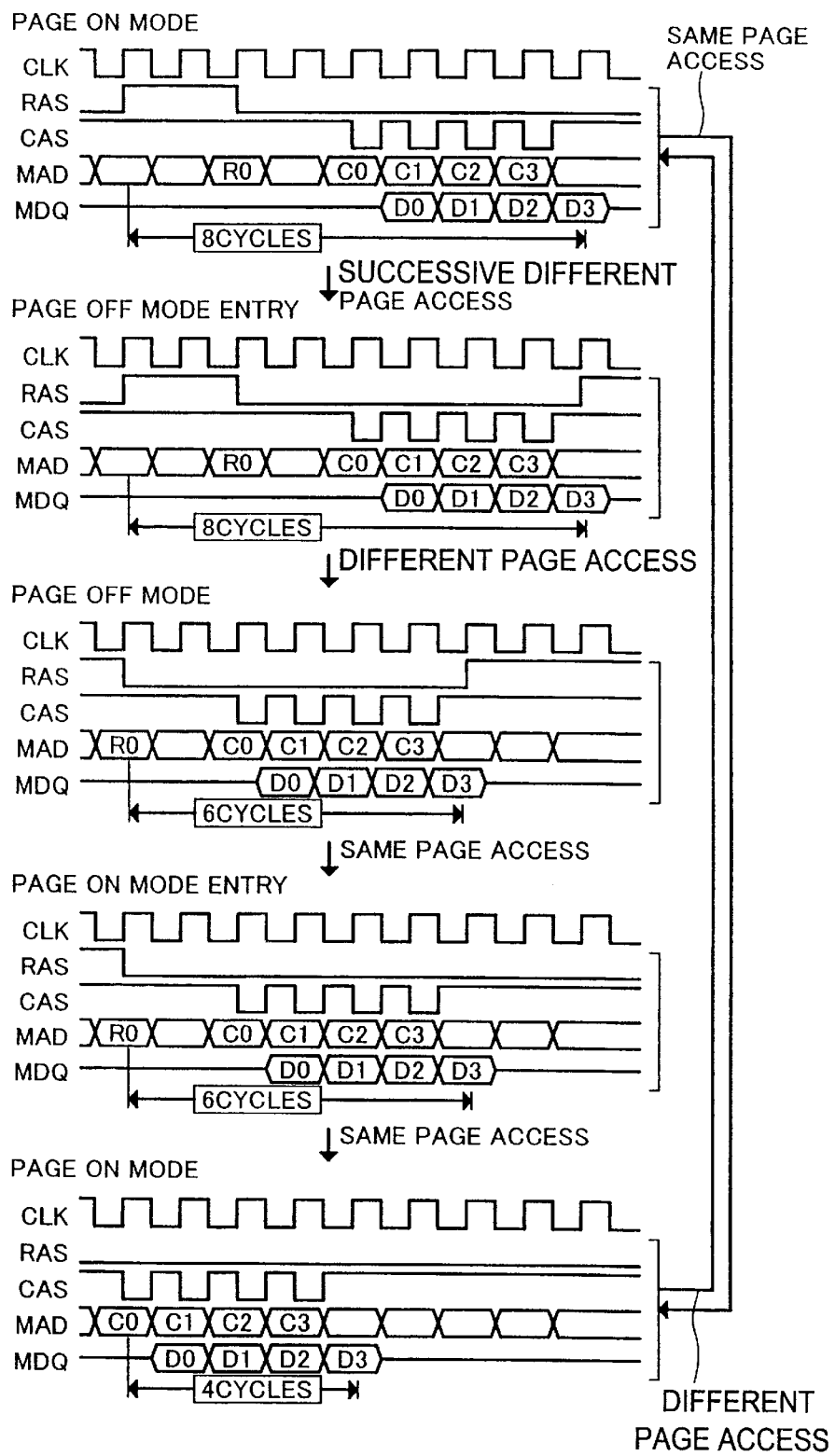
FIG. 26 is a set of timing charts showing the operation of a fifth embodiment of this invention.

FIG. 26 shows a set of timing charts showing the operation of the fifth embodiment of this invention, in which the memory module of FIG. 1 is formed of an EDO (extended data output) DRAM. The EDO-DRAM also has sense amplifiers corresponding to the memory banks. The EDO-DRAM features the asynchronous data transfer. By applying the present invention to the memory module MEM formed of the EDO-DRAM, a data processing system capable of high-speed operation can be accomplished.

Shown in FIG. 26 are the operational waveforms of the commands and addresses put out by the memory control circuit to the memory module MEM and data read out of the memory module in response to the input of the read command R to the memory control circuit MC in various modes switched by the memory control circuit MC.

In the case of the EDO-DRAM, the page is closed when the RAS signal goes high while the CAS signal is high. When the RAS signal goes low, with the CAS signal being high, the page specified by the row address opens. When the CAS signal goes low while the RAS signal is low, data specified by the column address is put out. The CAS and RAS signals are low-active signals, although the bar or slash symbol is not put on these signal names throughout this document.

At an event of different page access in the page-on mode, the RAS signal is turned high temporarily to implement the precharging in order to close the page which is open currently. The RAS signal is turned low thereafter to open the page specified by the row address R0. Subsequently, the CAS signal is turned low four times to put out data specified by the column addresses C0, C1, C2 and C3. The read latency is 8 cycles. At successive events of different page access, the page-on mode is switched to the page-off mode. Since the page has been closed in the previous access in the case of different page access, it is not necessary to turn the RAS signal high at the beginning to close the page, and the latency is 6 cycles.

At an event of same page access in the page-off mode, the mode is switched to the page-on mode. The same page access in the page-on mode is to the page which is open currently, instead of having to open another page, resulting in a latency of 4 cycles. Based on the mode switching control for the memory module of EDO-DRAM, a high-speed data processing system can be accomplished. It should be noted that constituents other than the EDO-DRAM, i.e., CPU, memory control unit MCU, etc., in FIG. 25 operate in synchronism with the clock signal CLK in issuing commands and addresses, and therefore the clock signal CLK is shown.

Although term "access" has been used in the explanation of the first through fifth embodiments, it signifies here the operation of putting an address into a memory and reading out data from the memory. An operational mode is established by setting a certain value in the register. In the foregoing embodiments, the mode is set by the register which is included in the CPU or memory controller.

It is possible for the foregoing embodiments to have a register for setting the modes of allowing and not allowing the switching between the page-on mode and page-off mode.

The data processor and memory control unit, i.e., memory controller, may be formed on separate semiconductor chips, or they may be formed on one semiconductor chip. A data processor and memory controller formed on one semiconductor chip can have the data bus DQ0 of a larger number of bits than the formation on different semiconductor chips, and moreover their shorter distance enables much faster data transfer.

It is also possible to put a memory controller, which has been designed in the past or designed by a third party, on the same semiconductor chip as of the data processor thereby to complete a one-chip data processor. In this case, it is possible to record design data of the memory controller on a recording medium and offer to the designer of data processor.

It is also possible to combine a data processor provided by a third party with the inventive memory controller, and supply the finished semiconductor device to the third party. The memory control unit may be included in the memory module. Forming the memory controller in the data processor or memory module reduces the work load of the manufacturer of data processing system and also enhances the compactness of data processing system.

It is also possible to form part or whole of the memory module on the same semiconductor chip as of the data processor in the course of progress of the manufacturing process of semiconductor devices, thereby accomplishing a more compact one-chip data processing system.

It is also possible to use the CPU to perform the memory control circuit on a software basis. This is possible obviously even in case the memory module and data processor are not formed on the same semiconductor chip. This scheme, however, will compel the CPU to work harder for the treatment of address and sacrifice the speed of other process in exchange for a reduced hardware component parts.

Figure 27:
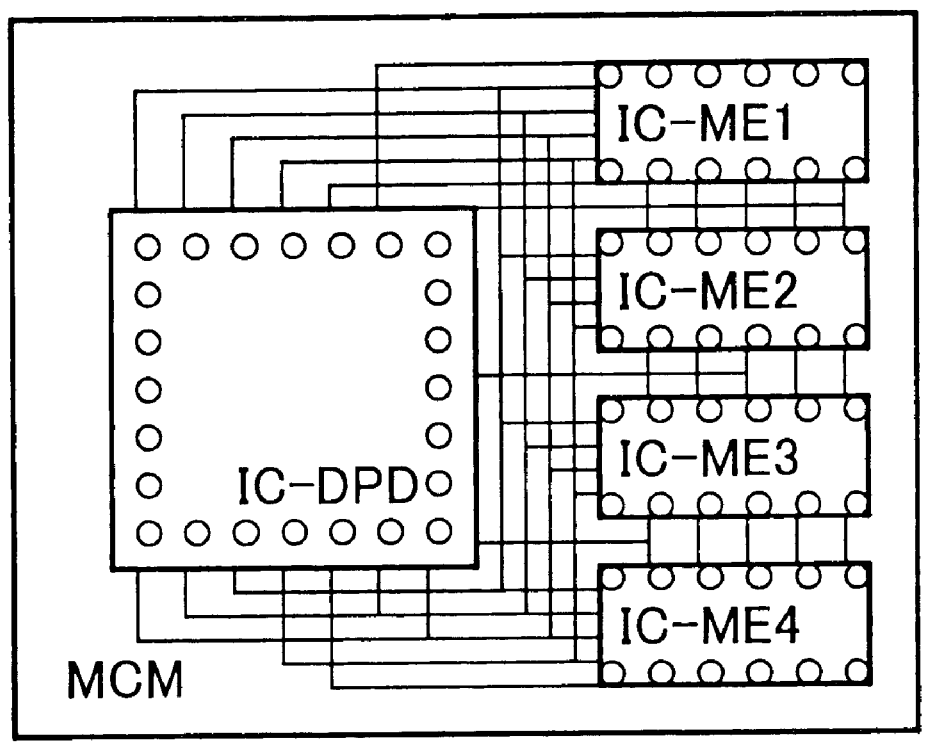
FIG. 27 is a diagram of a semiconductor device having the inventive data processing system built within a package.

Based on a separate arrangement of this invention, the effectiveness of this invention can be attained without an excessive addition to the CPU. A one-chip data processor IC-DPD and a one-chip memories (IC-ME1 through IC-ME4) may be packaged in a module to complete a semiconductor device as shown in FIG. 27. This arrangement is known to be a multi-chip module or multi-chip package.

Although the embodiments of the high-speed data processing system have been explained, the present invention is not confined to these embodiments, but various other embodiments are possible without departing from the essence of the present invention.

For example, it is possible to combine the predicted address generation circuit and predicted address checking circuit of the second embodiment, the automatic address alignment circuit of the third embodiment, and the revision of value of the access counter shown in the fourth embodiment with other embodiments. Combining the predicted address generation circuit and predicted address checking circuit with other embodiments enables the enhancement of the frequency of access to a same page, and further speed-up of data processor can be accomplished. Combining the automatic address alignment circuit with other embodiments enables the reduction of the frequency of operation of different pages, and further speed-up of data processor can be accomplished. Combining the revision of value of the access counter with other embodiments enables more sophisticated mode switching, and further speed-up of data processor can be accomplished. It is obviously possible to apply the above-mentioned combinations to other embodiments so as to bring out their multiplicative effectiveness.

Although the memory modules of the first, third, fourth and fifth embodiments are each made up of multiple memory banks, the present invention is also applicable to data processing systems having memory modules without a bank structure. It is also possible to speed up the memory access of data processing systems having memory modules without a bank structure.

According to the present invention, as described above, the provision of automatic mode change control which is responsive to the type of memory access enables the reduction of the latency of access to the memory module, whereby a high-speed data processing system can be accomplished. Furthermore, based on the switching control of next address generation or the automatic address alignment, a high-speed data processing system can be accomplished.

What is claimed is:

1. A method of controlling a multi bank memory by a memory controller having a first mode and a second mode,
   wherein said memory is controlled to perform a precharge operation after a read access in said first mode,
   wherein said memory is controlled to receive a next access command without a precharge operation after a read access in said second mode,
   wherein, after a first number of successive times a different word line is selected, said memory controller changes said second mode to said first mode, and
   wherein said first number changes depending on access commands from a CPU.

2. The method of controlling a multi bank memory according to claim 1,
   wherein, during said first mode, if an access to a same word line continues, a precharge operation before a read operation is omitted, and
   wherein, during said second mode, if an access to a different word line occurs, a precharge operation is performed before a read operation.

3. The method of controlling a multi bank memory according to claim 1,
   wherein said memory controller has a circuit comparing a first address inputted and the address previous to said first address after an access command to said memory corresponding to the first address has been issued.

4. The method of controlling a multi bank memory according to claim 3,
   wherein said circuit outputs a signal to control said first number.

5. The method of controlling a multi bank memory according to claim 3,
   wherein said first mode is a page off mode which closes a page after each access, and
   wherein said second mode is a page on mode which leaves the page open until a next access command is inputted.

6. A method of controlling a memory by a memory controller having a first mode and a second mode,
   wherein said memory is controlled to close a page opened by a read access in said first mode,
   wherein said memory is controlled to leave the page opened until it receives a next access command in said second mode,
   wherein, after a first number of successive times a different page is selected, said memory controller changes said second mode to said first mode, and
   wherein said first number changes depending on access commands from a CPU.

7. The method of controlling a memory according to claim 6,
   wherein an operation to close a page is to put the selected word line to be unselected and to precharge data lines of said memory.

8. The method of controlling a memory according to claim 7,
   wherein said memory controller has a circuit comparing a first address inputted and the address previous to said first address after an access command to said memory corresponding to the first address has been issued.

9. The method of controlling a memory according to claim 8,
   wherein said circuit outputs a signal to control said first number.

10. The method of controlling a memory according to claim 6,
    wherein, during said first mode, if an access to a same page continues, a precharge operation before a read operation is omitted,
    wherein, during said second mode, if an access to a different page occurs, a precharge operation is performed before a read operation.

11. The method of controlling a memory according to claim 6,
    wherein said memory comprises DRAM memory cells.

* * * * *